(12) United States Patent
Iwamoto et al.

(10) Patent No.: US 10,095,057 B2
(45) Date of Patent: Oct. 9, 2018

(54) TREATMENT AND/OR STABILIZING GASES IN AN OPTICAL GYRO BASED ON AN INORGANIC WAVEGUIDE

(71) Applicant: Honeywell International Inc., Morristown, NJ (US)

(72) Inventors: Nancy E. Iwamoto, Ramona, CA (US); Steven J. Sanders, Scottsdale, AZ (US); Timothy J. Callaghan, Roseville, MN (US); Stephen Yates, South Barrington, IL (US); Austin Taranta, Scottsdale, AZ (US); Jason C. Grooms, Saint Petersburg, FL (US); Kara L. Warrensford, Tampa, FL (US)

(73) Assignee: Honeywell International Inc., Morris Plains, NJ (US)

( * ) Notice: Subject to any disclaimer, the term of this patent is extended or adjusted under 35 U.S.C. 154(b) by 367 days.

(21) Appl. No.: 14/243,455

(22) Filed: Apr. 2, 2014

(65) Prior Publication Data

US 2015/0110438 A1 Apr. 23, 2015

Related U.S. Application Data

(60) Provisional application No. 61/894,625, filed on Oct. 23, 2013.

(51) Int. Cl.
*G02F 1/035* (2006.01)
*G01C 19/64* (2006.01)
(Continued)

(52) U.S. Cl.
CPC ............. *G02F 1/035* (2013.01); *B05C 3/02* (2013.01); *G01C 19/64* (2013.01); *G02F 1/0305* (2013.01);
(Continued)

(58) Field of Classification Search
CPC ....... G02F 1/035; G02F 1/0305; G01C 19/64; G06F 17/5009; B05C 3/02; G02B 2006/1204
See application file for complete search history.

(56) References Cited

U.S. PATENT DOCUMENTS 5,902,916 A 5/1999 Ruhl et al.
6,218,288 B1 * 4/2001 Li .................... C23C 16/045
257/E21.011

(Continued)

FOREIGN PATENT DOCUMENTS

EP 1600531 11/2005
JP 60017078 A * 1/1985 ....... C23C 16/45523

OTHER PUBLICATIONS

Catella et al., Effect of Nitrogen on the Linear Oxidation of Niobium, Jun. 1971, Journal Electrochemistry Society, vol. 118, No. 6, pp. 1006-1009.*

(Continued)

*Primary Examiner* — Thomas A Hollweg
*Assistant Examiner* — Erin Chiem
(74) *Attorney, Agent, or Firm* — Fogg & Powers LLC

(57) ABSTRACT

A system is provided, the system including at least one integrated optical circuit (IOC) formed from at least one material, and a support-structure configured to support the at least one IOC to couple light between other components. A performance of the at least one IOC is improved by treatment with at least one selected gas.

20 Claims, 20 Drawing Sheets

(51) Int. Cl.
*G06F 17/50* (2006.01)
*G02F 1/03* (2006.01)
*B05C 3/02* (2006.01)
*G02B 6/12* (2006.01)

(52) U.S. Cl.
CPC .. *G06F 17/5009* (2013.01); *G02B 2006/1204* (2013.01)

(56) References Cited

U.S. PATENT DOCUMENTS

| | | | |
|---|---|---|---|
| 7,228,046 | B1 | 6/2007 | Hendry et al. |
| 7,323,050 | B2* | 1/2008 | Shiono ............. C30B 33/00 117/86 |
| 7,351,657 | B2 | 4/2008 | Barnes et al. |
| 7,645,633 | B2 | 1/2010 | Barnes et al. |
| 8,070,368 | B1 | 12/2011 | Moody et al. |
| 8,189,981 | B2 | 5/2012 | Muller et al. |
| 8,405,280 | B2 | 3/2013 | Ochi et al. |
| 2003/0024475 | A1 | 2/2003 | Anderson |
| 2007/0116421 | A1* | 5/2007 | Hendry ............. G02F 1/035 385/132 |
| 2007/0247785 | A1 | 10/2007 | Nanataki et al. |
| 2009/0191352 | A1 | 7/2009 | DuFaux et al. |
| 2009/0211526 | A1 | 8/2009 | Tanaka et al. |
| 2009/0230817 | A1 | 9/2009 | Kurachi et al. |
| 2010/0066212 | A1 | 3/2010 | Denneler et al. |
| 2010/0135610 | A1 | 6/2010 | Feth |
| 2011/0117202 | A1 | 5/2011 | Bourke, Jr. et al. |
| 2013/0171546 | A1 | 7/2013 | White et al. |
| 2014/0270617 | A1 | 9/2014 | Muller et al. |
| 2016/0246079 | A1 | 8/2016 | Iwamoto et al. |

OTHER PUBLICATIONS

European Patent Office, "Partial EP Search Report from EP Application No. 1418627036 dated Mar. 19, 2015", "from Foreign Counterpart of U.S. Appl. No. 14/243,455", dated Mar. 19, 2015, pp. 1-5, Published in: EP.

Asano et al., "Potassium-doped Co3O4 catalyst for direct decomposition of N2O", "Applied Catalysis B: Environmental", Sep. 19, 2007, pp. 242-249, Publisher: Elsevier B.V.

Chaos et al., "Ambient gas effects during the growth of lithium niobate films by pulsed laser deposition", "Applied Surface Science", 2000, pp. 473-477, Publisher: Elsevier Science B.V.

Jorgensen et al., "High Temperature Transport Processes in Lithium Niobate", "J. Phys. Chem. Solids", 1969, pp. 2639-2648, vol. 30, Publisher: Pergamon Press, Published in: GB.

Parmon et al., "Nitrous oxide in oxidation chemistry and catalysis: application and production", "Catalysis Today", 2005, pp. 115-131, Publisher: Elsevier B.V.

Piskorz et al., "Decomposition of N2O over the surface of covaly spinel: A DFT account of reactivity experiments", "Catalysis Today", May 1, 2008, pp. 418-422, Publisher: Elsevier B.V.

Russo et al., "N2O catalytic decomposition over various spinel-type oxides", "Catalysis Today", Sep. 11, 2006, Publisher: Elsevier B.V.

Schroeder et al., "Determination of Oxidizing Ability of Gases and Gas Mixtures", "Flammability and Sensitivity of Materials in Oxygen-Enriched Atmospheres", 2000, pp. 456-468, vol. 9, Publisher: ASTM Int'l.

Stelmachowski et al., "Mg and Al substituted cobalt spinels as catalysts for low temperature deN2O—Evidence for octahedral cobalt active sites", "Applied Catalysis B: Environmental", May 18, 2013, pp. 105-111, Publisher: Elsevier et aL.

Stelmachowski et al., "Strong electronic promotion of Co3O4 towards N2O decomposition by surface alkali dopants", "Catalysis Communications", Jan. 8, 2009, pp. 1062-1065, Publisher: Elsevier B.V.

European Patent Office, "Office Action from EP Application No. 14186270.6 dated May 3, 2016", "from Foreign Counterpart of U.S. Appl. No. 14/243,455", dated May 3, 2016, pp. 1-7, Published in: EP.

European Patent Office, "Extended European Search Report from EP Application No. 16155375.5 dated Jul. 22, 2016", "from Foreign Counterpart of U.S. Appl. No. 14/628,933", dated Jul. 22, 2016, pp. 1-9, Published in: EP.

European Patent Office, "Extended European Search Report from EP Application No. 14186270.6 dated Jul. 10, 2015", "from Foreign Counterpart of U.S. Appl. No. 14/243,455", dated Jul. 10, 2015, pp. 1-14, Published in: EP.

Zeng et al., "Oxygen Adsorption on Anatase TiO2 (101) and (001) Surfaces From First Principles", "Materials Transactions", Dec. 9, 2009, pp. 171-175, vol. 51, No. 1, Publisher: The Japan Institute of Metals, Published in: JP.

U.S. Patent and Trademark Office, "Notice of Allowance", "U.S. Appl. No. 14/628,933", dated Jun. 15, 2017, pp. 1-48.

U.S. Patent and Trademark Office, "Supplemental Notice of Allowability", "U.S. Appl. No. 14/628,933", dated Aug. 3, 2017, pp. 1-8, Published in: US.

European Patent Office, "Communication under Rule 71(3) EPC from EP Applicaiton No. 14186270.6 dated Apr. 4, 2017", "from Foreign Counterpart of U.S. Appl. No. 14/243,455", dated Apr. 4, 2017, pp. 1-67, Published in: EP.

European Patent Office, "Extended European Search Report, from EP Application No. 17186102.4, dated Oct. 4, 2017", "from Foreign Counterpart of U.S. Appl. No. 14/243,455", dated Oct. 4, 2017, pp. 1-9.

U.S. Patent and Trademark Office, "Corrected Notice of Allowability", "U.S. Appl. No. 14/628,933", dated Oct. 6, 2017, pp. 1-10, Published in: US.

* cited by examiner

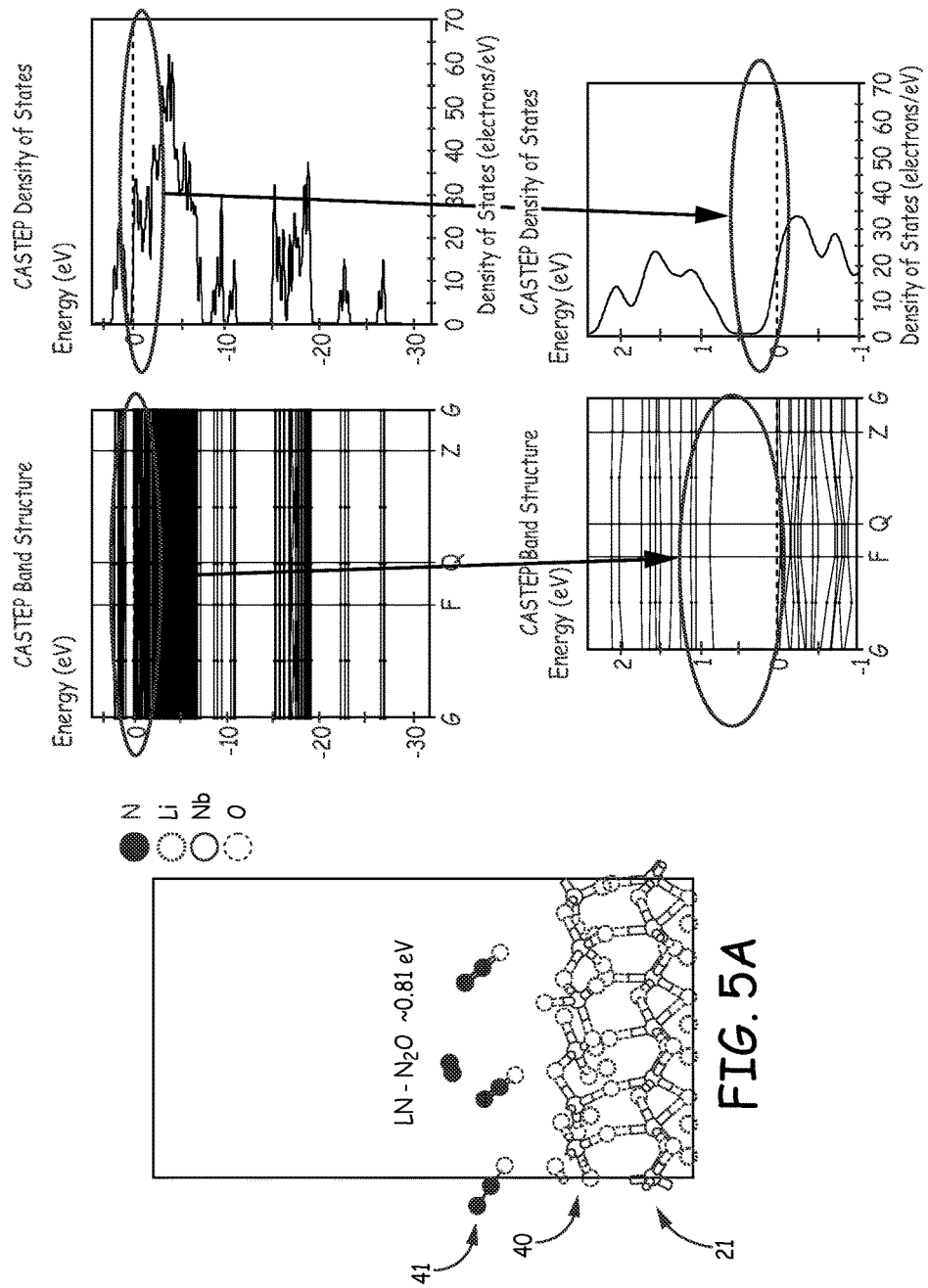

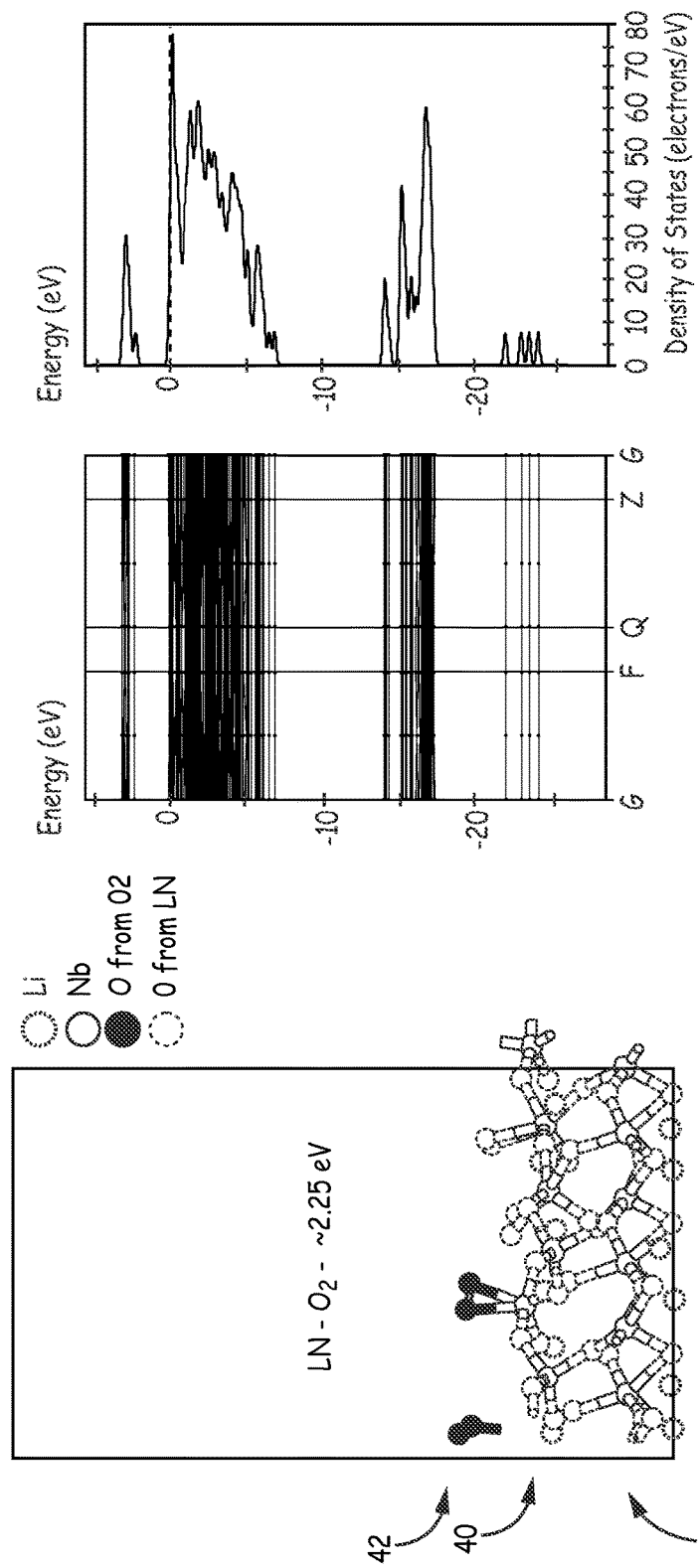

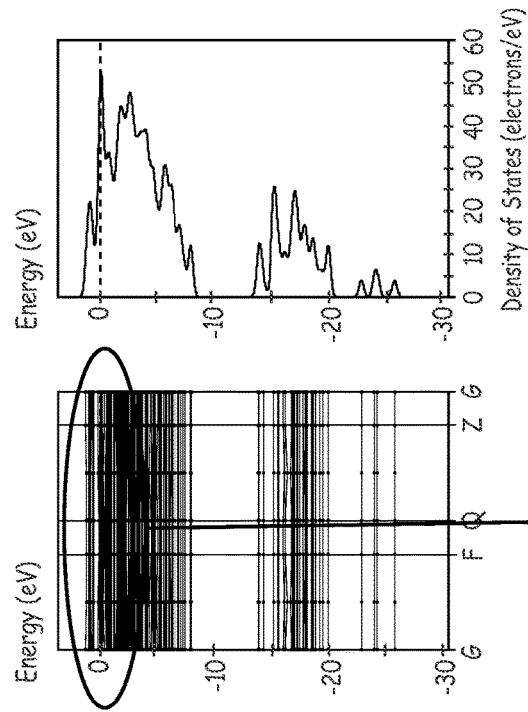
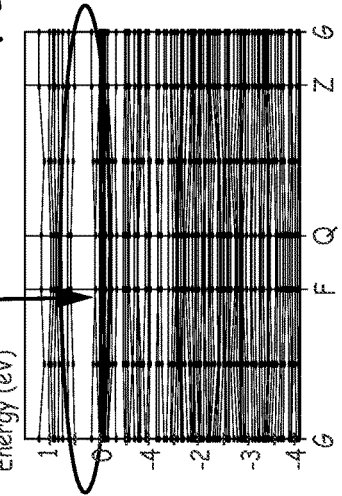
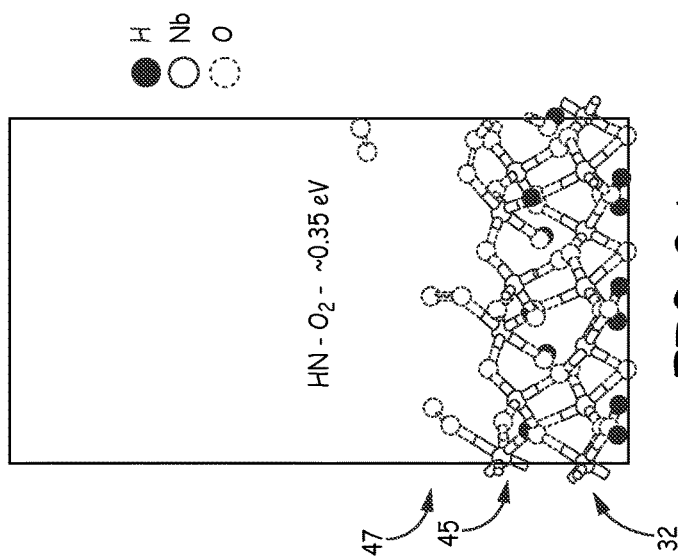
FIG. 8C
FIG. 8B
FIG. 8A

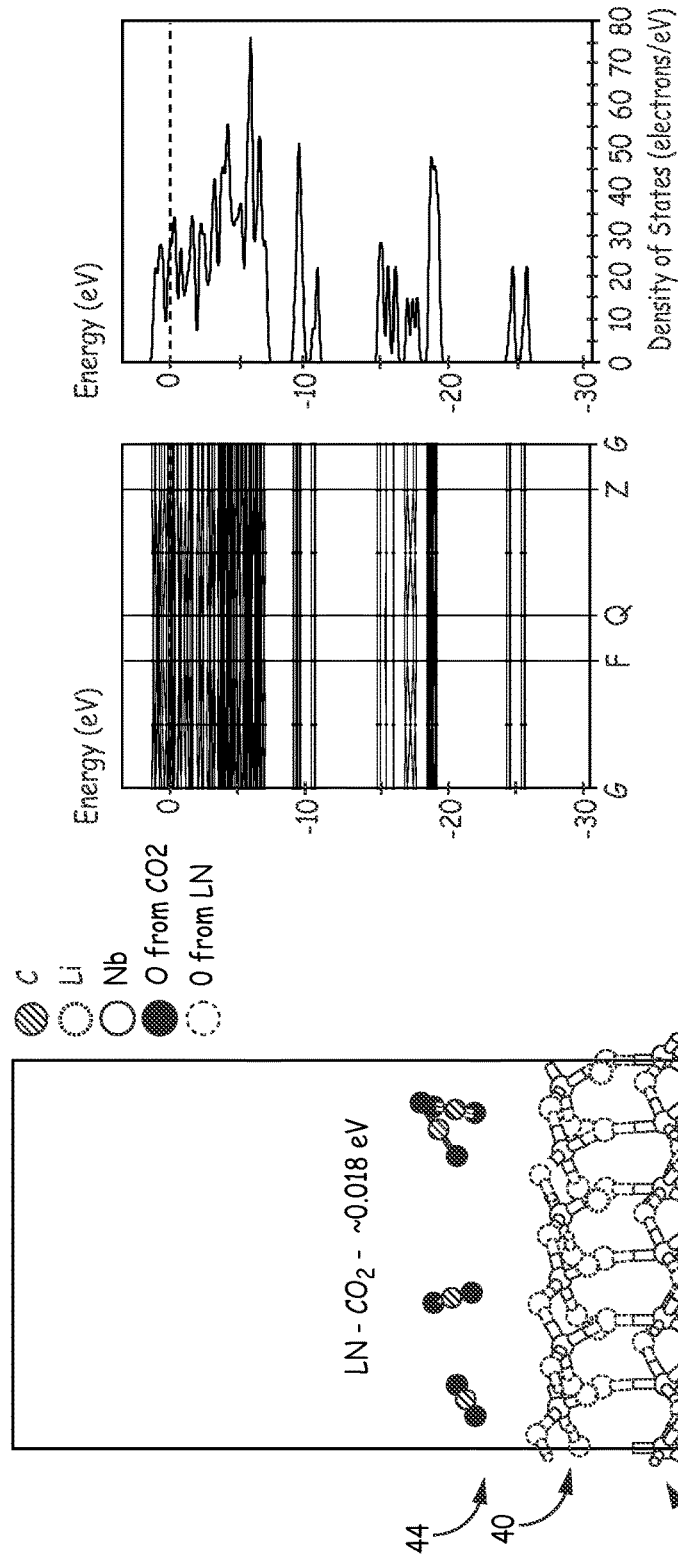

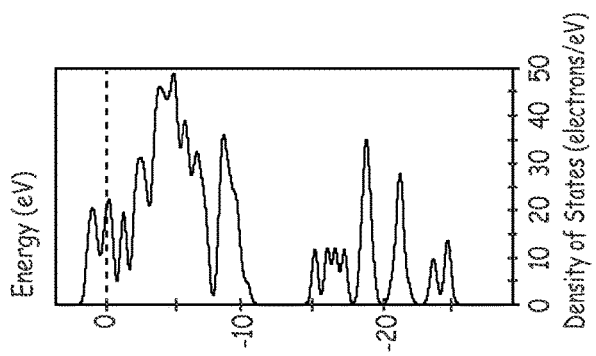
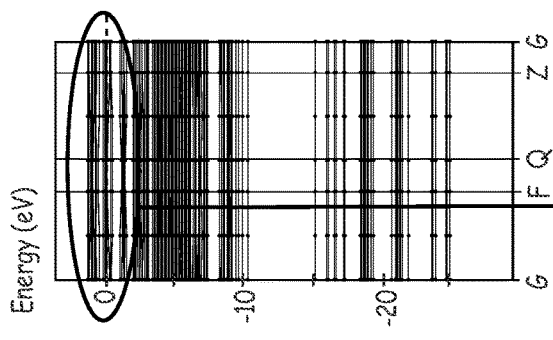
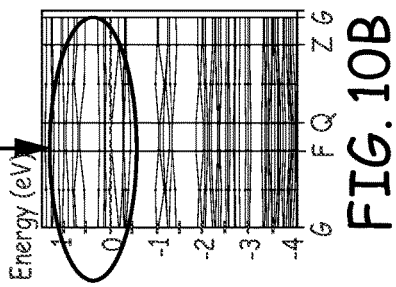
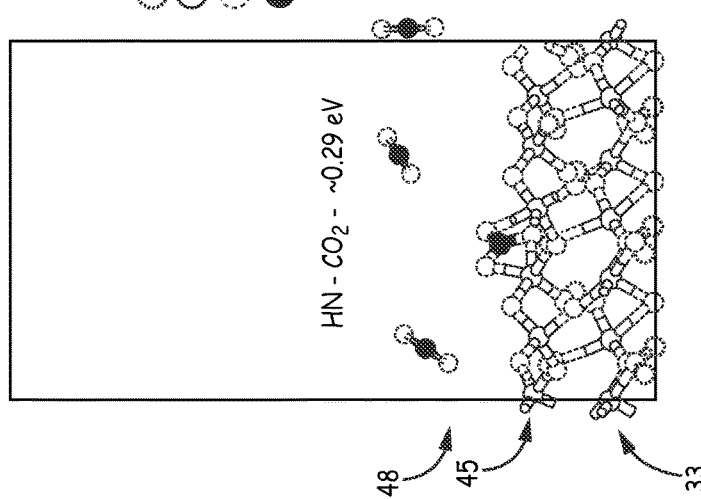
FIG. 10A
FIG. 10B
FIG. 10C

TREATMENT AND/OR STABILIZING GASES IN AN OPTICAL GYRO BASED ON AN INORGANIC WAVEGUIDE

This patent application claims priority to U.S. Provisional Patent Application No. 61/894,625, entitled "TREATMENT AND/OR STABILIZING GASES IN AN OPTICAL GYRO BASED ON AN INORGANIC WAVEGUIDE" filed Oct. 23, 2013, which is hereby fully incorporated herein by reference.

BACKGROUND

Currently available high-performance fiber-optic gyros (FOG) typically employ lithium niobate modulators. Lithium niobate (LN) is the material of choice for high-bandwidth modulation of the optical phase waveform to allow closed-loop operation of the gyroscope and to enable scale factor nonlinearity on the order of parts per million (ppm) over wide dynamic ranges. It is known that lithium niobate modulators suffer from crystal defects, which produce sensitivities to environment, especially vacuum or other gas exposures as is shown in U.S. Pat. No. 7,228,046 to Hendry et al. entitled ENVIRONMENTALLY STABLE ELECTRO-OPTIC DEVICE AND METHOD FOR MAKING SAME. For this reason, some FOG designs employ a hermetic seal with oxygen-based backfill gases to stabilize LN defects that might otherwise be destabilized by vacuum or other gas exposure.

In standard terrestrial uses of LN phase modulators, the devices are typically immersed in 1-atmosphere air. As known to one skilled in the art, air includes about 20.9% oxygen. It is also known that the conductivity of lithium niobate increases with decreasing oxygen partial pressure (see W. Jorgensen and R. W. Bartlett, J. Phys. Chem Solids 30 (12), 2639, 1969). In other words, exposure to the oxygen in air keeps the conductivity of LN low. Defects in the waveguides of LN modulators, especially waveguides manufactured by the process of annealed proton exchange (APE) can contribute to environmentally-induced changes in conductivity as is shown in U.S. Pat. No. 8,189,981 to Muller et al. entitled STABLE LITHIUM NIOBATE WAVEGUIDES, AND METHODS OF MAKING AND USING SAME. Exposure to oxygen serves to stabilize these defects and prevent changes in annealed proton exchange LN performance.

When a LN phase modulator has a low band gap, the modulator has electrical leakage. In a vacuum, the uncoordinated sites in the lithium niobate material are not filled, which causes the band gap to drop to a low level that is below the band gap of lithium niobate material in $O_2$.

Another problem for currently available lithium niobate phase modulators may occur when other components near the lithium niobate phase modulator outgas. Some outgassed species may degrade the LN bandgap even further.

SUMMARY

The present application relates to a system including at least one integrated optical circuit (IOC) formed from at least one material, and a support-structure configured to support the at least one IOC to couple light between other components. A performance of the at least one IOC is improved by treatment with at least one selected gas.

DRAWINGS

Understanding that the drawings depict only exemplary embodiments and are not therefore to be considered limiting in scope, the exemplary embodiments will be described with additional specificity and detail through the use of the accompanying drawings, in which:

FIG. 1A is a model of bulk lithium niobate;
FIG. 1B shows the calculated band structure of the bulk lithium niobate of FIG. 1A;
FIG. 1C shows the calculated density of states of the bulk lithium niobate of FIG. 1A;
FIG. 2A is a model of bulk hydrogen niobate;
FIG. 2B shows the calculated band structure of the bulk hydrogen niobate of FIG. 2A;
FIG. 2C shows the calculated density of states of the bulk hydrogen niobate of FIG. 2A;
FIG. 3A is a model of a lithium niobate surface in a vacuum;
FIG. 3B shows the calculated band structure of the lithium niobate surface in a vacuum of FIG. 3A in accordance with the present application;
FIG. 3C shows the calculated density of states of the lithium niobate surface in a vacuum of FIG. 3A in accordance with the present application;
FIG. 4A is a model of a hydrogen niobate surface in a vacuum;
FIG. 4B shows the calculated band structure of the hydrogen niobate surface in a vacuum of FIG. 4A in accordance with the present application;
FIG. 4C shows the calculated density of states of the hydrogen niobate surface in a vacuum of FIG. 4A in accordance with the present application;
FIG. 5A is a model of a lithium niobate surface exposed to $N_2O$ gas in accordance with the present application;
FIG. 5B shows the calculated band structure of the lithium niobate surface exposed to $N_2O$ gas of FIG. 5A in accordance with the present application;
FIG. 5C shows the calculated density of states of the lithium niobate surface exposed to $N_2O$ gas of FIG. 5A in accordance with the present application;
FIG. 6A is a model of a hydrogen niobate surface exposed to $N_2O$ gas in accordance with the present application;
FIG. 6B shows the calculated band structure of the hydrogen niobate surface exposed to $N_2O$ gas of FIG. 6A;
FIG. 6C shows the calculated density of states of the hydrogen niobate surface exposed to $N_2O$ gas of FIG. 6A;
FIG. 7A is a model of a lithium niobate surface exposed to $O_2$ gas in accordance with the present application;
FIG. 7B shows the calculated band structure of the lithium niobate surface exposed to $O_2$ gas of FIG. 7A in accordance with the present application;
FIG. 7C shows the calculated density of states of the lithium niobate surface exposed to $O_2$ gas of FIG. 7A in accordance with the present application;
FIG. 8A is a model of a hydrogen niobate surface exposed to $O_2$ gas in accordance with the present application;
FIG. 8B shows the calculated band structure of the hydrogen niobate surface exposed to $O_2$ gas of FIG. 8A;
FIG. 8C shows the calculated density of states of the hydrogen niobate surface exposed to $O_2$ gas of FIG. 8A;
FIG. 9A is a model of a lithium niobate surface exposed to $CO_2$ gas in accordance with the present application;
FIG. 9B shows the calculated band structure of the lithium niobate surface exposed to $CO_2$ gas of FIG. 9A in accordance with the present application;
FIG. 9C shows the calculated density of states of the lithium niobate surface exposed to $CO_2$ gas of FIG. 9A in accordance with the present application;

FIG. 10A is a model of a hydrogen niobate surface exposed to $CO_2$ gas in accordance with the present application;

FIG. 10B shows the calculated band structure of the hydrogen niobate surface exposed to $CO_2$ gas of FIG. 10A;

FIG. 10C shows the calculated density of states of the hydrogen niobate surface exposed to $4CO_2$ gas of FIG. 10A;

Figure 18:
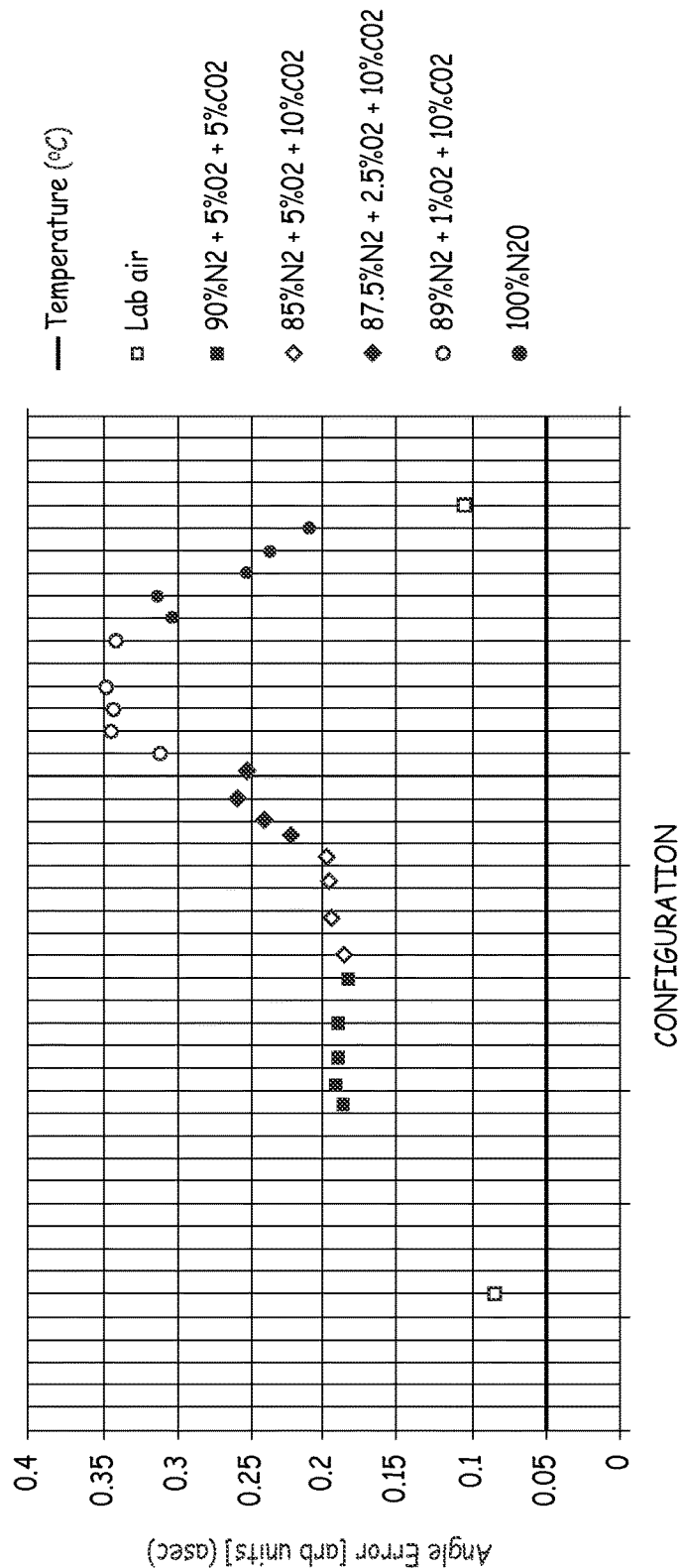
Figure 19:
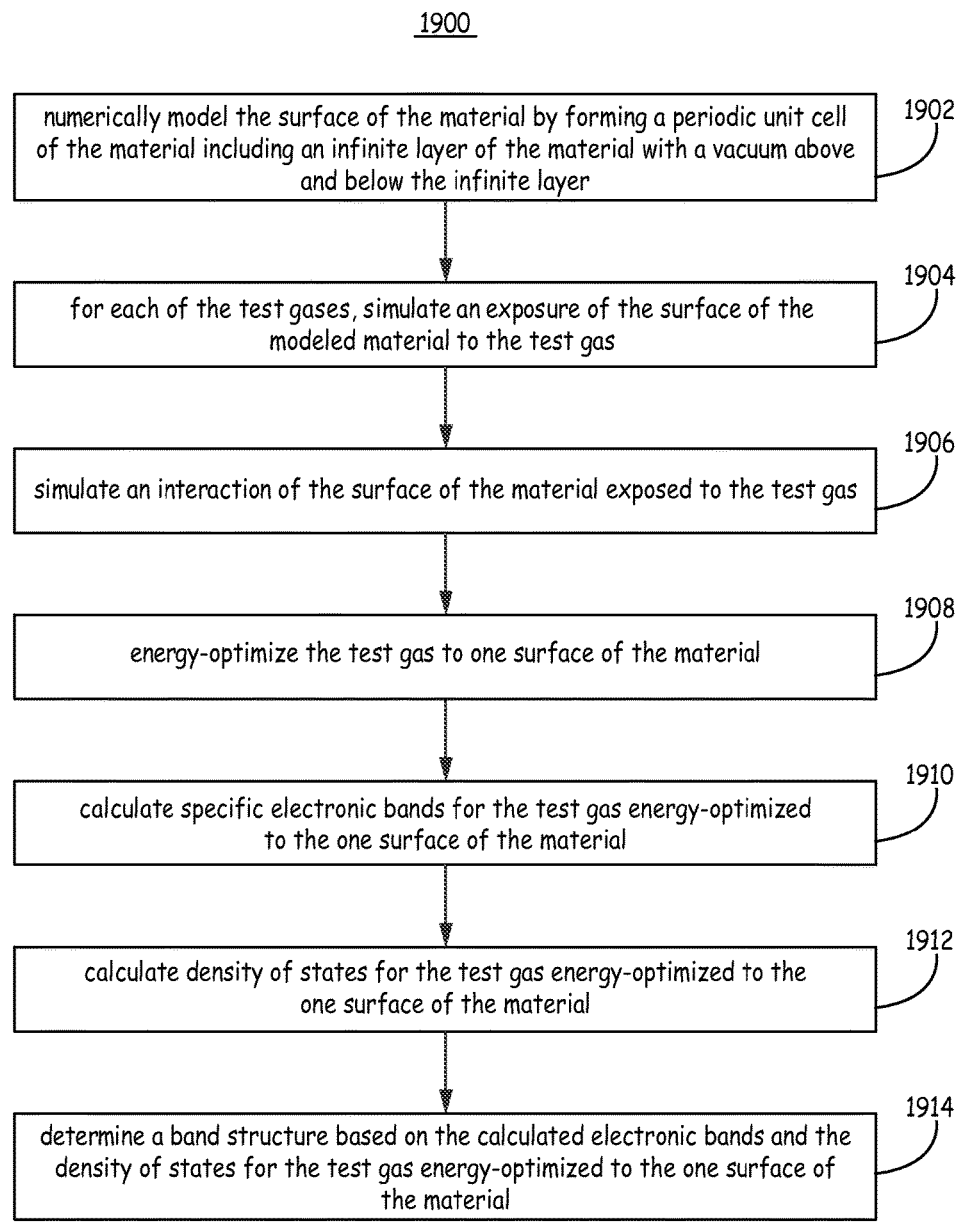
Figure 20:
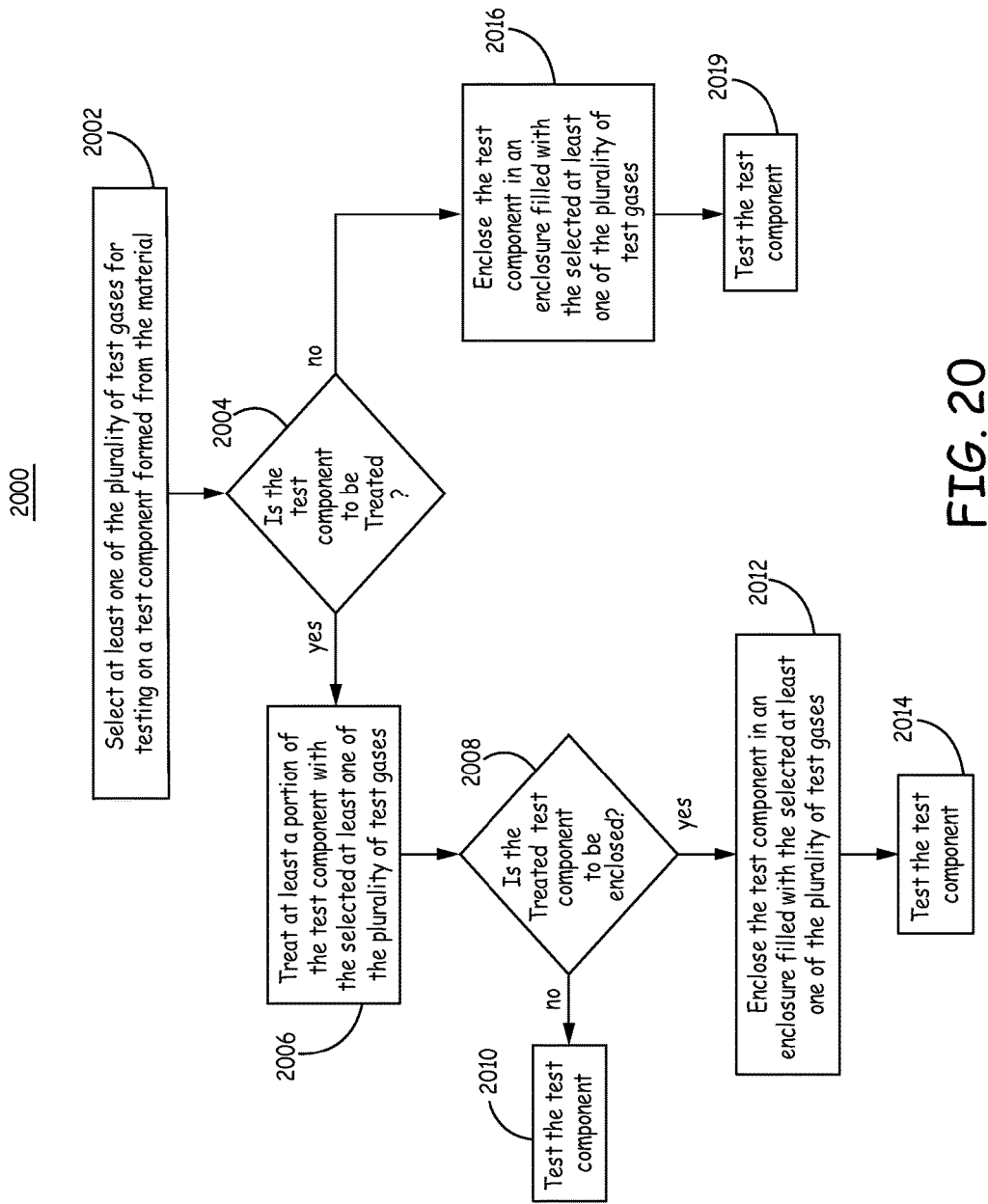

FIG. 18 plots measurements of a gyroscope angle error measured in arc-second unit of angle for various configurations of gases;

FIG. 19 is a flow diagram of an embodiment of a method to determine a gas to stabilize surface states of a material in accordance with the present application; and FIG. 20 is a flow diagram of an embodiment of a method to test a test component exposed to a gas to stabilize surface states of a material forming the test component in accordance with the present application.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

High-performance fiber-optic gyroscopes may include lithium niobate modulators. Such lithium niobate modulators include an optical waveguide (e.g., an integrated optical chip (IOC)) formed in the lithium niobate material. Lithium niobate (also referred to herein as LN) is a dielectric material that is highly electrically insulating at room temperature. Good gyroscopic performance relies on the insulating property and the stability of the insulating property of LN over time and over temperature changes. The terms "gyroscope" and "gyro" are used interchangeably herein. As defined herein, gyro performance includes angle noise and scale factor nonlinearity. A high performance gyro has an angle noise of less than 10 arcesc over some bandwidth of interest and a scale factor nonlinearity of less than 100 ppm over some rotation dynamic range.

The modeling and testing techniques described herein are used to select gases to overcome the disadvantages of the currently available LN-based phase modulators. The LN-based phase modulators include modulators formed from proton exchanged (HN) lithium niobate materials in an IOC. As defined herein proton exchanged lithium niobate materials are lithium-niobate-based materials. The technology described herein selects one or more gas that is optimally suited to remove, prevent, or minimize surface defect states of lithium-niobate-based material based on modeling and testing a plurality of test gases. The IOCs described herein are formed from a niobium oxide-based electro-optic inorganic material. The term "inorganic material" as used herein refers to "niobium oxide-based electro-optic inorganic material" or "lithium-niobate-based material".

The gases that provide a relatively high band gap (with reference to a vacuum) are used to pretreat the material, enclose the gas in a sealed enclosure with the material, or both. For example, a selected gas can be used as a pretreatment gas and/or fill gas for a LN-based phase modulator in a gyroscope.

Over time and temperature changes, an integrated optical chip that includes a lithium niobate waveguide that is not treated according to the technology described herein can become slightly more conductive, allowing electrical leakage. This electrical leakage degrades gyro performance. Specifically, this electrical leakage can cause increases in both angle noise and in the scale factor nonlinearity. As is known to one skilled in the art, electrical leakage in any crystalline inorganic materials (e.g., LN) is related to the width of the electronic band gap for any surface defect states. More specifically, as is known to one skilled in the art, the electrical leakage in the LN (or HN) is related to the width of the electronic band gap for any surface defect states.

As described above, exposure to oxygen serves to stabilize these defects that allow electrical leakage and prevent changes in LN performance. This is due to the $O_2$ filling valence bonding sites on the niobium. There are different types of bonds that can form with ligands. One type is due to a neutral coordination from a ligand (usually found in zero charged metal centers), in which case there is electron donation from $O_2$ p orbitals usually to empty d orbitals on the metal. The type is due to covalent bond formation, in which case electrons from Nb and $O_2$ are shared and the $O_2$, as well as the Nb, contributes electrons into the bond. The stronger sigma bonds have some s hybridization pulling the ligand closer than for a neutral ligand. For covalently bonded ligands, the bond becomes even stronger if there is pi bond back-donation from the metal center from d on the metal to p on the ligand. In other words there is more sharing, but also a loss of electrons from the metal center to the oxygen. In the partial density of states, without $O_2$, there are s, p, and d bands above the valence band, which disappear when $O_2$ is added. These bands shift below the Fermi into the bonding levels.

As known to one skilled in the art, the conductivity of a solid is low when the energy gap between the valence band and the conduction band of the material is large compared to thermal energy at the temperatures of operation. Hence, a large energy gap, or bandgap, ensures lower conductivity, and a small bandgap is indicative of higher conductivity.

Numerical modeling and simulations may be used to determine the effect on bandgap of exposing the lithium niobate surface to oxygen. Calculations show that the conduction bandgap is relatively large in the presence of oxygen and that, conversely, the bandgap is a relatively low value when the surface is deprived of oxygen.

When a properly selected gas contacts a material, the chemistry causes a reduction in surface defect states. As defined herein, "treating at least one surface of an inorganic material" comprises: (1) passive pre-treatment with no extra forcing conditions, (2) active pre-treatment under temperature, pressure, radiation, etc.; (3) fill with no pre-treatment; (4) fill with activating temperature, pressure, radiation conditions; (5) passive pre-treatment plus passive fill; (6) passive pre-treatment with fill under activating conditions; (7) activated pre-treatment plus passive fill; and (8) active pre-treatment plus active fill. The gas encasing the inorganic material is referred to herein as a fill gas (or backfill gas). In this case, the inorganic material is positioned in a housing or sealed enclosure and the housing is filled with the gas to encase the inorganic material in the gas. In this manner, the encased gas contacts (treats) the inorganic material. The housing or sealed enclosure is appropriately designed to permit use of the inorganic material in a test unit or a system.

As is understandable to one skilled in the art, temporary exposure of the IOC to a treatment gas prior to operation of the IOC-based device in a system is distinguished from an exposure of the IOC to a fill gas during operation of the IOC-based device in a system.

The backfill gases and/or treatment gases that ensure the highest LN band gaps represent optimum candidates for stabilizing the LN in an IOC. The lithium niobate IOC is packaged with stabilizing gases (selected based on modeling) to: 1) stabilize the lithium niobate performance; and 2) minimally or negligibly interact with other internal components/materials of the fiber optical gyroscope.

A method is provided for determining the optimal fill gas or gases for lithium niobate stabilization, based on: 1) numerically modeling the lithium niobate surface; 2) observing the interaction of the modeled lithium niobate surface with various fill gases, including the coordination of niobium to the fill-gas atoms; and 3) estimating the electronic band gaps of any observed surface states. The models consist of a periodic unit LN cell containing an infinite layer of the niobate, with vacuum space above and below the infinite layer. The test gas is energy-optimized to one surface of the infinite layer, and a calculation of the band structure is done. All calculations employ commercially available quantum mechanics software employing density functional theory (such as CASTEP from Accelrys, Inc.).

In some embodiments, the lithium in lithium niobate of the IOC is partially exchanged for hydrogen. This produces a mixture of hydrogen niobate referred to herein as FIN within LN. LN can be the base inorganic material used in the IOC. The partially proton exchanged lithium niobate is the active form used in the integrated optical chip waveguide and is commonly referred to as annealed proton exchanged lithium niobate (or APE lithium niobate). The cases in the modeling described below, which correspond most closely to APE lithium niobate, are fully hydrogen exchanged lithium niobate. The fully hydrogen exchanged lithium niobate is referred to herein as hydrogen niobate (or FIN). In this latter case, a periodic unit cell of hydrogen niobate is used in the modeling. Both LN and FIN have the same performance concerns when used to form an IOC in a gyroscope.

The band gap of either LN or FIN is determined by calculating the specific electronic bands and the density of states, and using band energies above and below the minimum in the density of states nearest the Fermi level to establish a relative band gap. This method accounts for energies near the Fermi level which may be populated due to surface states, in a consistent manner for comparisons.

A remediation gas is also referred to herein as a coordinating gas. An uncoordinated site is also referred to herein as an unbonded site or defect. A coordinating species is a species that is stable by itself, but prefers to be associated with another species. A coordinating species is also referred to herein as a ligand. Given enough thermal treatment, a coordinating species can be disassociated from a surface to which is it bonded. A reactive species is a species that is less stable by itself, but is more stable when bonded to another species or breaks bonds in order to from species that are most stable when bonded to another species. More energy is required to remove a reactive species when bonded to another species. A reactive gas will possibly react to other gases generated by the components associated with the integrated optical chip. A reactive species also includes an oxidizing species in which the oxidizing species either causes the reactant surface to increase its oxidation state or reduces the electron density of the reactant surface.

The modeling described here has been done for a plurality of test gases on LN and FIN. For bulk FIN, which has no gas exposure, the lowest band gap is 2.887 eV. When FIN is in a vacuum, the lowest band gap is 0.242 eV. Thus, the vacuum strongly influences the FIN material by producing a drop in the bandgap. Table 1 shows the model-estimated results for electronic band gaps of observed surface states for the respective plurality of test gases applied to FIN material (all proton exchanged). The first column and fourth columns indicate the test gas. The second column shows the lowest band gap in electron volts (eV) for the test gas in the first column. The fifth column shows the lowest band gap in electron volts (eV) for the test gas in the fourth column. In the tables shown herein, the number of molecules is indicated to illustrate the relative ratio when two or more types of molecules are combined.

TABLE 1

| HN (all proton exchanged) | Lowest band gap (eV) | HN (all proton exchanged) | Lowest band gap (eV) |
| --- | --- | --- | --- |
| 4O | 2.802 | 4Ar | 0.293 |
| 4O + 4CO$_2$ | 2.659 | 4Ne | 0.292 |
| 2O + 4CO$_2$ | 2.168 | 4CH$_3$ | 0.291 |
| 2O | 2.054 | 4CH$_4$ | 0.291 |
| 4O$_2$ + 4Ne | 1.916 | 4He | 0.29 |
| 4NO | 1.686 | 4Kr | 0.288 |
| 4NO$_2$ | 1.662 | 2Ne | 0.286 |
| (4Xe + 4O$_2$ optimized) then CO$_2$ added to model | 1.559 | 2He | 0.286 |
| 4O$_2$opt + 4Ne | 1.533 | 2x butane | 0.286 |
| 4Xe + 4O$_2$ | 1.474 | 2x butene | 0.286 |
| 4Xe + 4CO$_2$ + O$_2$ | 1.438 | 6Xe | 0.285 |

TABLE 1-continued

| HN (all proton exchanged) | Lowest band gap (eV) | HN (all proton exchanged) | Lowest band gap (eV) |
|---|---|---|---|
| (4Xe + 4CO$_2$ optimized) then O$_2$ added to model | 1.289 | 6He | 0.284 |
| 4NO + 4CO$_2$ | 1.232 | 4Rn | 0.284 |
| 4O$_3$ | 1.076 | 6Ne | 0.284 |
| 4SO$_2$ | 0.972 | 4MeOH | 0.283 |
| 4O$_2$ + 4N$_2$ | 0.891 | 4x butene | 0.283 |
| 4O$_3$ + 4CO$_2$ | 0.793 | 4H$_2$ | 0.282 |
| 6N$_2$O | 0.724 | 1O | 0.279 |
| 4NH$_2$CO$_2$H | 0.692 | 4N$_2$O + 2CO | 0.276 |
| 4N$_2$O | 0.607 | 2CO$_2$ | 0.274 |
| 4NH$_3$ | 0.591 | 4CO$_2$ + 4Ne | 0.248 |
| 4N$_2$O + 4NH$_3$ | 0.56 | 4CO$_2$ + 4He | 0.246 |
| 6NH$_3$ | 0.552 | 4x ipa | 0.241 |
| 4CO$_2$ + 4NH$_3$ | 0.519 | 4N$_2$O + 4CO | 0.229 |
| 6CO (3 coord) | 0.495 | 4x isobutene | 0.228 |
| 4PMe$_3$ | 0.494 | 4NH$_3$ | 0.225 |
| 4CO (4 coord) | 0.442 | 4CF$_4$ | 0.19 |
| 4N$_2$O + 4CO$_2$ | 0.435 | hexamethyl disilane | 0.197 |
| 4O$_2$ + 4He | 0.396 | 2Si(Me)(OMe)2OH | 0.197 |
| 6O$_2$ + 1CO$_2$ | 0.383 | 6NH$_3$ | 0.196 |
| 4O$_2$ | 0.349 | 2x isobutene | 0.189 |
| 6O$_2$ | 0.346 | 4OPMe$_3$ | 0.177 |
| 4O$_2$ + 1CO$_2$ | 0.345 | 2O$_2$ | 0.168 |
| 2x 1butene | 0.341 | 4HCN | 0.165 |
| 4x butane | 0.336 | 6CO$_2$ | 0.165 |
| 2N$_2$O | 0.321 | 1O$_2$ | 0.165 |
| 4Xe | 0.32 | CF$_3$CH$_2$CFH$_2$ | 0.161 |
| 2N$_2$O + 2CO$_2$ | 0.317 | hexamethyl trisiloxane | 0.151 |
| 4O$_2$ optimized then 4He added to model | 0.309 | 2O$_2$ + 1CO$_2$ | 0.151 |
| 4CO (1 coord) | 0.305 | 4CHF$_3$ | 0.149 |
| 6O$_2$ + 1CO$_2$ | 0.302 | 1 (Me$_2$OHSi)2O | 0.138 |
| 4Xe + 4CO$_2$ | 0.3 | 2Si(Me$_3$)OH | 0.101 |
| 6N$_2$ | 0.299 | 1CO$_2$ | 0.073 |
| 4N$_2$ | 0.293 | 1CO$_2$ | 0.065 |

For bulk LN the lowest band gap is 3.305 eV and the Fermi level is −4.176 eV. When LN is in a vacuum, the lowest band gap is 0.025 eV. The vacuum strongly influences the LN material by producing a drop in the bandgap. Table 2 shows the model-estimated results for electronic band gaps of observed surface states for the respective plurality of test gases applied to LN material. The first column indicates the test gas. The second column shows the lowest band gap in electron volts (eV).

TABLE 2

| LN (all proton exchanged | Lowest band gap (eV) |
|---|---|
| 4O$_2$ | 2.254 |
| 4CO$_2$ | 0.018 |
| 4O$_3$ | 2.703 |
| 4N$_2$O | 0.807 |

Some gases interact with the surface of LN or FIN to create relatively high LN or FIN band gaps or to increase the band gaps over the gas-free case by: 1) forming a capping bond (typically O) on the niobium; 2) increasing the formal coordination around the niobium; and/or 3) providing an electron-donating species to niobium. As an example, O$_2$, which has been mentioned as a typical fill-gas, raises the vacuum bandgap from 0.242 eV to 0.349 eV for FIN and from 0.025 eV to 2.254 eV for LN. In one implementation of this embodiment, N$_2$O and O$_3$ gases form a formal Nb—X capping bond (X is an O or N atom) that results in high band gaps. In another implementation of this embodiment, non-reactive gases such as NH$_3$ and PMe$_3$ gases form coordination with Nb and thereby change the mechanism from classic oxidation.

In some embodiments, the test gas is an electron-rich noble gas. For example, Xe gas keeps the band gap above the vacuum level. When combined with O$_2$, Xe is observed to enhance the Nb—O bond and thereby raise the band gap. As shown in Table 1 above, 4Xe+4O$_2$ on HN has a band gap of approximately 1.474 eV and 4Xe+4CO$_2$+O$_2$ on FIN has a band gap of approximately 1.438 eV. Thus, Xe is combined with O$_2$ for maximal effect. Xe appears to force better coordination of the O$_2$ as the Nb—O (from O$_2$) bond distances are shortened. Instead of a terminal Nb—O—O coordination there is a 3 membered ring center for the NbO$_2$. A treatment of O$_2$ followed by Xe enhances the Nb-bond and thereby raises the band gap. The same effect found for Xe was also found for Ne, but not for He. As shown in Table 1 above, 4O$_2$opt+4Ne on FIN has a band gap of approximately 1.533 eV. As shown in Table 1 above, 4O$_2$+4He on FIN has a band gap of approximately 0.396 eV. The O$_2$ gas, which forms coordination to niobium, increases the band gap over that of the gas-free vacuum on HN (i.e., 0.242 eV), especially when the O$_2$—Nb bond becomes shorter indicating a stronger bond.

Non-reactive gases, such as CO$_2$ and fluorocarbons, lower the band gap because they do not help to satisfy the coordinate state of niobium.

As indicated in Tables 1 and 2, the gases N$_2$O, O$_3$, NH$_3$ and PMe$_3$ increase the band gap as they can help satisfy the coordination state of niobium. The gases NH$_3$ and PMe$_3$ are useful coordinating gases that do not further react. The gases O$_3$ and N$_2$O are useful reactive gases. O$_3$ may provide a capping oxygen atom to the niobate surface, liberating O$_2$ which may coordinate to the niobium. However, N$_2$O functions both as a reactive and coordinating gas, depending upon the conditions.

Other treatment gases that exhibit large band gaps above that of N$_2$O include NO, NO$_2$ and SO$_2$, which are highly coordinating gases and reactive. The latter gases may have other reactions (such as acid formation with water). In one implementation of this embodiment, coordinating gases, such as but not limited to N$_2$O, NO, NO$_2$, SO$_2$, NH$_3$ and PMe$_3$, are used as the gyro or modulator-encasing atmosphere.

Although NH$_3$ is a classic Lewis base, and may corrode metal parts, other nitrogen-based or Group V-based molecules with lower basicity are likely to be useful without corrosion, such as triazines, phosphazines, and phosphines. For example, PMe$_3$ on an HN surface was found to have a calculated bandgap of 0.494 eV, which is better than O$_2$. However, PMe$_3$ should not be used with oxygen due to PMe$_3$'s high tendency to oxidize and form an oxide, which lowers the HN band gap to 0.177 eV (lower than the O$_2$). PMe$_3$ is related to a general group of alkyl phosphine compounds sometimes used in corrosion inhibitors and most commonly used in more stable phosphonate forms. Thus, a more stable phosphine, with less reactivity than PMe$_3$ or side reactions than NH$_3$, is useful in increasing the band gap.

Figure 1A:
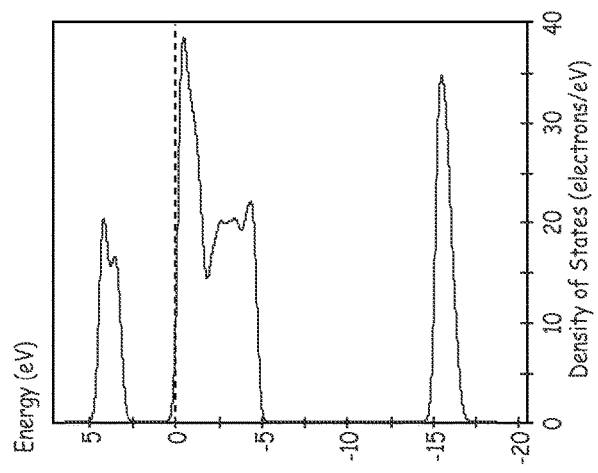
Figure 1B:
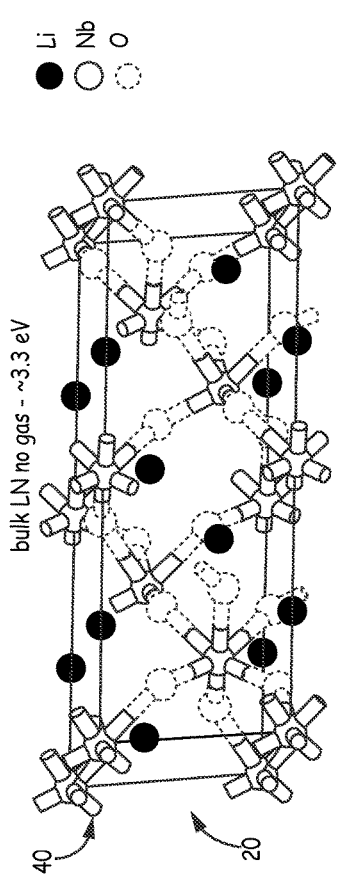
Figure 1C:
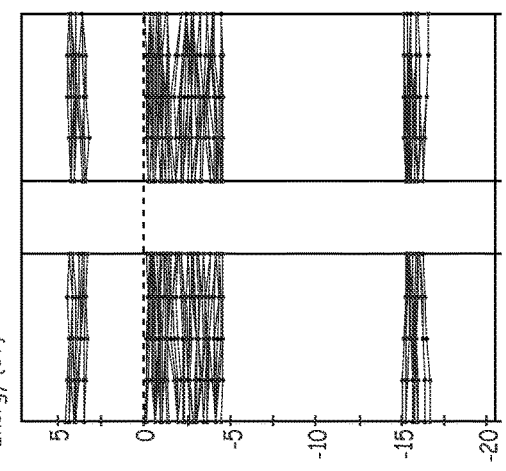

The results shown in Tables 1 and 2 were obtained by modeling. Some exemplary modeling cases are now described with reference to FIGS. 1A-10C. Figure 1A is a model of bulk lithium niobate 20. FIG. 1B shows the calculated band structure of the bulk lithium niobate 20 of FIG. 1A. FIG. 1C shows the calculated density of states of the bulk lithium niobate 20 of FIG. 1A. The band structures show the calculated energies of both the conduction bands (above the Fermi level designated at zero) and the valence bands (below the Fermi Level designated at zero. The density of states diagrams show some states valence states may exist above the Fermi level and so are important in determining the bandgap (which is taken using the highest valence band and the lowest conduction band.) The bulk lithium niobate 20 is modeled as a periodic unit LN cell containing an infinite layer of the niobate. The band gap for bulk LN is approximately 3.305 eV. In a bulk unit cell, which is an infinite mass, all of the niobium sites are satisfied (i.e., bonded). When the all of the niobium sites are satisfied, the band gap is maximized. It is desirable to have a high band gap for a lithium niobate phase modulator. In the following FIGS. 2B, 3B, 4B, 5B, 6B, 7B, 8B, 9B and 10B, the calculated band gap is the spacing between the upper bands and the lower bands as is known to one skilled in the art. When an infinite mass is removed from the bulk unit cell of lithium niobate, by creating a surface, the band gap decreases.

Figure 2A:
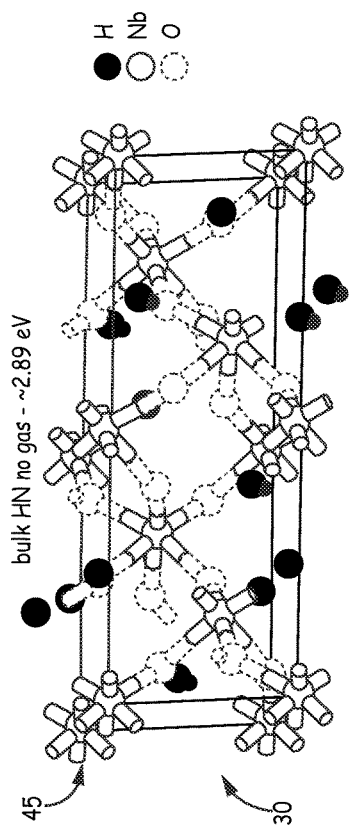
Figure 2B:
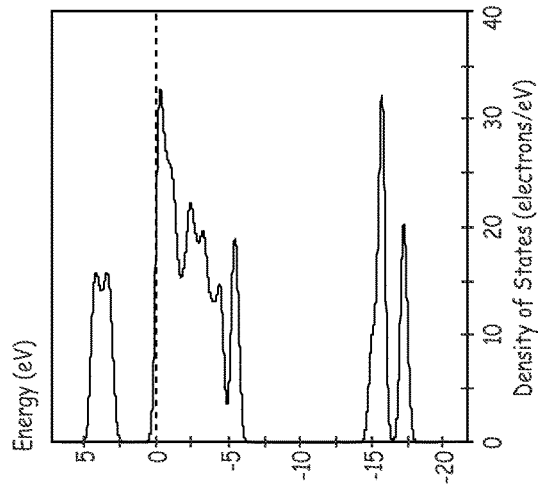
Figure 2C:
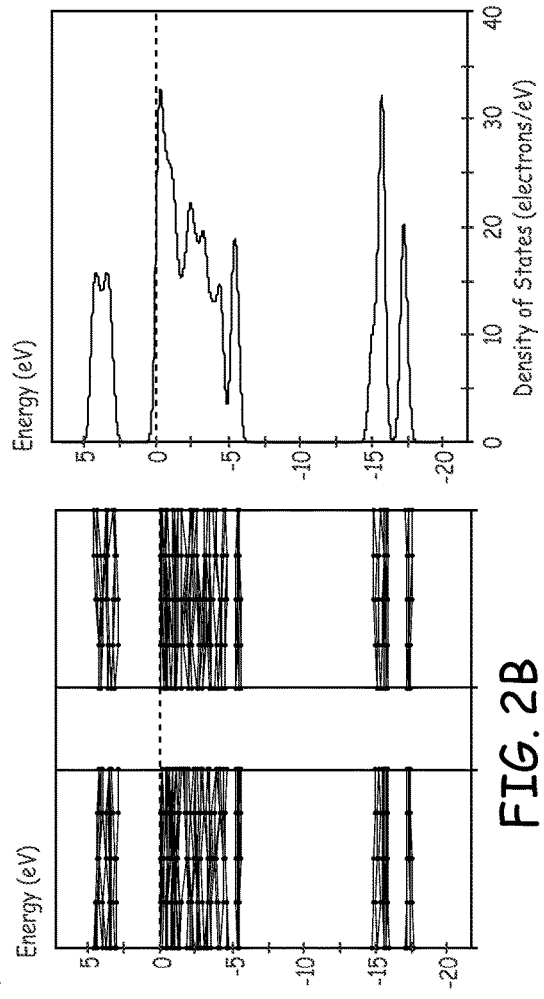

FIG. 2A is a model of bulk hydrogen niobate. FIG. 2B shows the calculated band structure of the bulk hydrogen niobate of FIG. 2A. FIG. 2C shows the calculated density of states of the bulk hydrogen niobate of FIG. 2A. The bulk hydrogen niobate 20 is modeled as a periodic unit HN cell containing an infinite layer of the niobate. The band gap for bulk FIN is approximately 2.887 eV, lower than the bulk LN case.

Figure 3A:
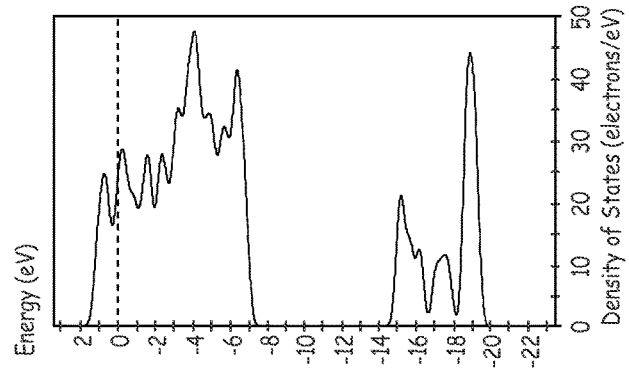
Figure 3B:
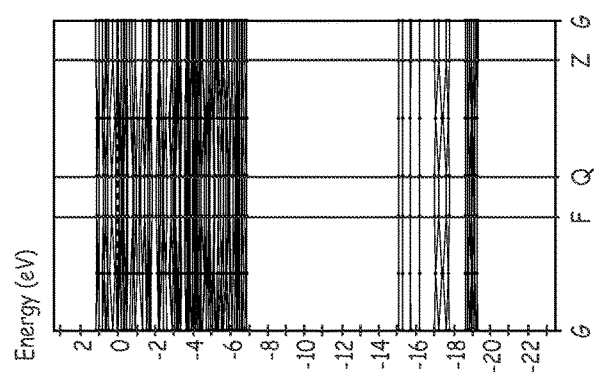
Figure 3C:
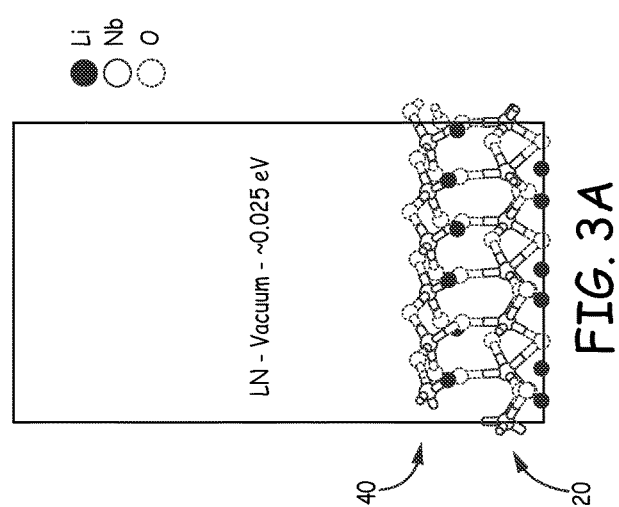

FIG. 3A is a model of a lithium niobate surface 40 in a vacuum. The modeled lithium niobate material represented generally at 20 has a surface 40 that is exposed to the vacuum. FIG. 3B shows the calculated band structure of the lithium niobate surface 40 in a vacuum of FIG. 3A in accordance with the present application. FIG. 3C shows the calculated density of states of the lithium niobate surface 40 in a vacuum of FIG. 3A in accordance with the present application. The bulk lithium niobate 20 is modeled as a periodic unit LN cell containing an infinite layer of the niobate, with vacuum space above a surface 40 and a vacuum below the infinite layer (not visible in FIG. 3A). The band gap for bulk LN in a vacuum is approximately 0.025 eV. This drop in band gap of about 3.28 eV from the bulk modeled band gap of 3.305 eV indicates how detrimental the vacuum is on LN in terms of raising conductivity.

Figure 4C:
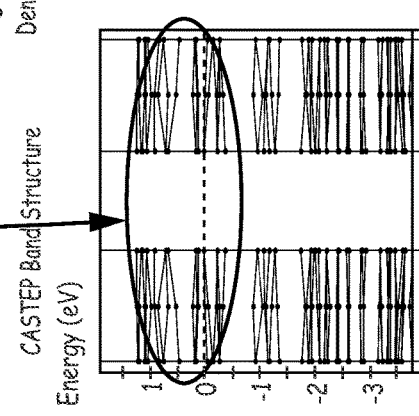
Figure 4B:
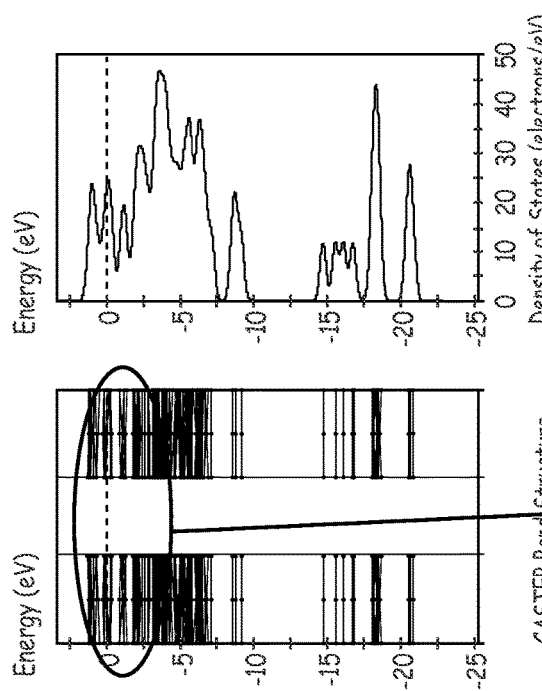
Figure 4A:
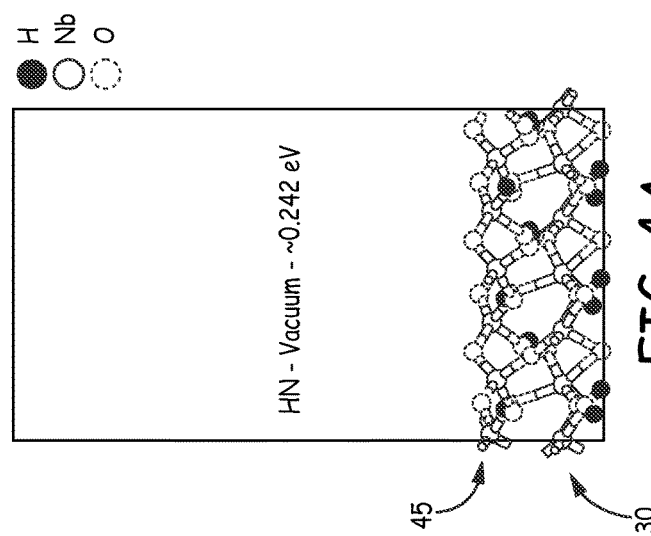

FIG. 4A is a model of a hydrogen niobate surface 45 in a vacuum. The modeled hydrogen niobate material represented generally at 30 has a surface 45 that is exposed to a vacuum. FIG. 4B shows the calculated band structure of the hydrogen niobate surface 45 in a vacuum of FIG. 4A in accordance with the present application. FIG. 4C shows the calculated density of states of the hydrogen niobate surface 45 in a vacuum of FIG. 4A in accordance with the present application. The bulk hydrogen niobate 30 is modeled as a periodic unit LN cell containing an infinite layer of the niobate, with a vacuum space above the surface 40 and a vacuum below the infinite layer (not visible in FIG. 4A). The band gap for bulk FIN in a vacuum is approximately 0.242 eV. This drop in band gap of about 2.645 eV from the bulk modeled band gap of 2.887 eV indicates how detrimental the vacuum is on FIN in terms of raising conductivity.

FIG. 5A is a model of a lithium niobate surface exposed to $N_2O$ gas in accordance with the present application. The modeled lithium niobate material represented generally at 21 has a surface 40 that is exposed to $N_2O$ gas represented generally at 41. Specifically, the lithium niobate exposed to $N_2O$ gas 41 is referred to herein as lithium niobate 21. The $N_2O$ gas 41 is also referred to herein as a test gas 41. FIG. 5B shows the calculated band structure of the lithium niobate surface 40 exposed to the $N_2O$ gas 41 of FIG. 5A in accordance with the present application. FIG. 5C shows the calculated density of states of the lithium niobate surface 40 exposed to $N_2O$ gas 41 of FIG. 5A in accordance with the present application. The band gap of the lithium niobate surface 40 exposed to $N_2O$ gas 41 is approximately 0.807 eV.

The band gap shown for FIG. 5B is obtained as follows. After numerically modeling the surface 40 of the LN material 21, a simulation of an exposure of the surface 40 to a test gas 41 is performed. The electronic band gap of observed surface states for the test gas 41 is then estimated by: 1) energy-optimizing the test gas 41 to the surface 40 of the LN material 21; 2) calculating specific electronic bands (FIG. 5B) for the test gas 41 energy-optimized to the one surface 40 of the material 20; 3) calculating density of states (FIG. 5C) for the test gas 41 energy-optimized to the surface 40 of the LN material 21; and 4) determining a band structure based on the calculated electronic bands and the density of states for the test gas 41 energy-optimized to the surface 40 of the LN material 21. The band energies above and below the minimum in the density of states nearest the Fermi level are used to estimate electronic band gap for the test gas 41. The same technique is applied to FIGS. 7A-7C and 9A-9C.

Figure 6C:
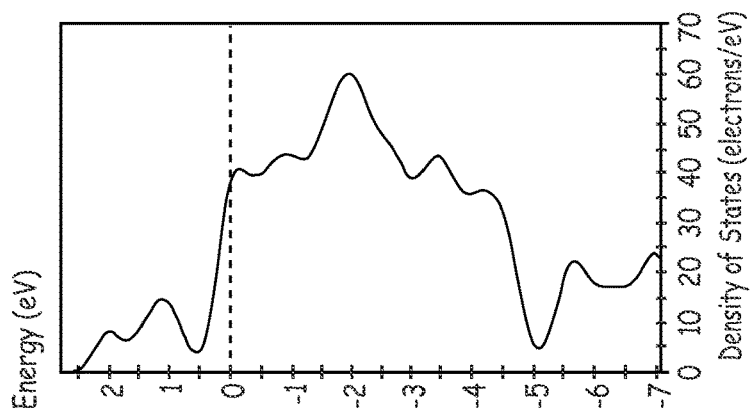
Figure 6B:
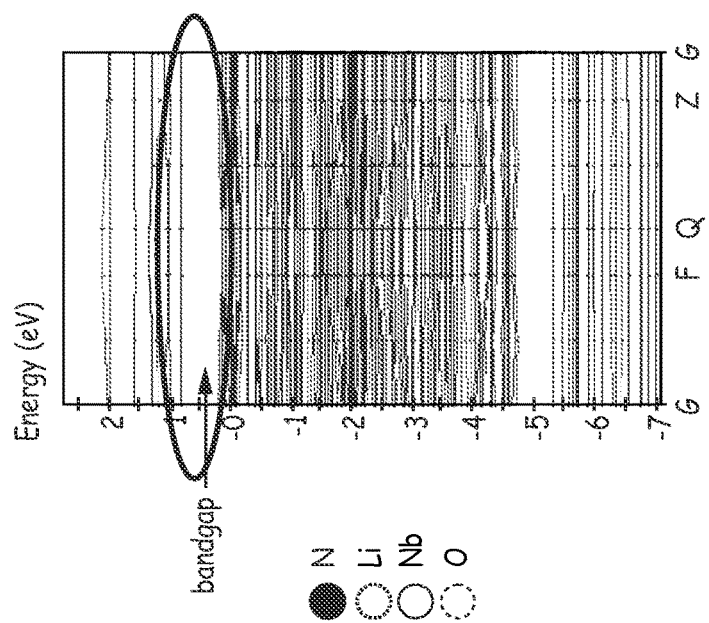
Figure 6A:
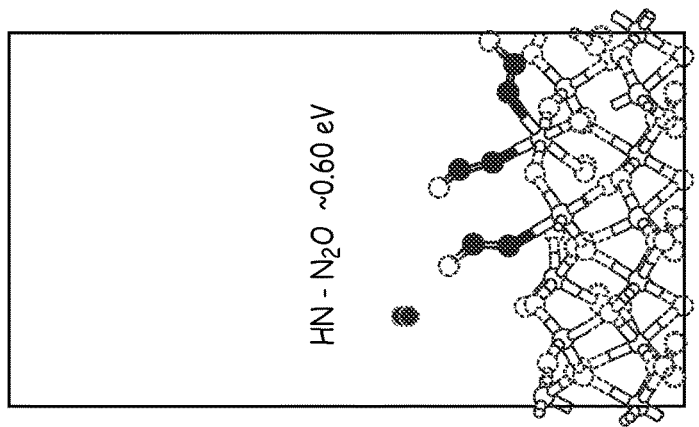

FIG. 6A is a model of a hydrogen niobate surface exposed to $N_2O$ gas in accordance with the present application. The modeled hydrogen niobate material represented generally at 31 has a surface 45 that is exposed to $N_2O$ gas represented generally at 46. Specifically, the hydrogen niobate that is exposed to $N_2O$ gas 46 is referred to herein as hydrogen niobate 31. The $N_2O$ gas 46 is also referred to herein as a test gas 46. FIG. 6B shows the calculated band structure of the hydrogen niobate surface 45 exposed to the $N_2O$ gas 46 of FIG. 6A. FIG. 6C shows the calculated density of states of the hydrogen niobate surface 45 exposed to $N_2O$ gas 46 of FIG. 6A. The band gap of the hydrogen niobate surface 45 exposed to $N_2O$ gas 46 is approximately 0.60 eV.

The band gap shown for FIG. 6B is obtained as follows. After the numerically modeling the surface 45 of the FIN material 31, a simulation of an exposure of the surface 45 to a test gas 46 is performed. The electronic band gap of observed surface states for the test gas 46 is then estimated by: 1) energy-optimizing the test gas 46 to the surface 45 of the FIN material 31; 2) calculating specific electronic bands (FIG. 6B) for the test gas 46 energy-optimized to the one surface 45 of the material 20; 3) calculating density of states (FIG. 6C) for the test gas 46 energy-optimized to the surface 45 of the FIN material 31; and 4) determining a band structure based on the calculated electronic bands and the density of states for the test gas 46 energy-optimized to the surface 45 of the FIN material 31. The band energies above and below the minimum in the density of states nearest the Fermi level are used to estimate electronic band gap for the test gas 46. The same technique is applied to FIGS. 8A-8C and 10A-10C.

FIG. 7A is a model of a lithium niobate surface exposed to $O_2$ gas in accordance with the present application. The modeled lithium niobate material represented generally at 22 has a surface 40 that is exposed to $O_2$ gas represented generally at 42. Specifically, the lithium niobate exposed to $O_2$ gas 42 is referred to herein as lithium niobate 22. The $O_2$ gas 42 is also referred to herein as a test gas 42. FIG. 7B shows the calculated band structure of the lithium niobate surface 40 exposed to $O_2$ gas 42 of FIG. 7A in accordance with the present application. FIG. 7C shows the calculated density of states of the lithium niobate surface 40 exposed to $O_2$ gas 42 of FIG. 7A in accordance with the present application. The band gap of the lithium niobate surface 40 exposed to $O_2$ gas 42 is approximately 2.254 eV. Thus, the $O_2$ gas 42 is advantageous in increasing the band gap of the lithium niobate 22.

FIG. 8A is a model of a hydrogen niobate surface exposed to $O_2$ gas in accordance with the present application. The modeled hydrogen niobate material represented generally at 32 has a surface 45 that is exposed to $O_2$ gas represented generally at 47. Specifically, the hydrogen niobate exposed to $O_2$ gas 47 is referred to herein as hydrogen niobate 32. The $O_2$ gas 47 is also referred to herein as a test gas 47. FIG. 8B shows the calculated band structure of the hydrogen niobate surface 45 exposed to $O_2$ gas 47 of FIG. 8A. FIG. 8C shows the calculated density of states of the hydrogen niobate surface 45 exposed to $O_2$ gas 47 of FIG. 8A. The band gap of the hydrogen niobate surface 45 exposed to $O_2$ gas 47 is approximately 0.349 eV.

FIG. 9A is a model of a lithium niobate surface exposed to $CO_2$ gas in accordance with the present application. The modeled lithium niobate material represented generally at 23 has a surface 40 that is exposed to $CO_2$ gas represented generally at 44. Specifically, the lithium niobate exposed to $CO_2$ gas 44 is referred to herein as lithium niobate 23. The $CO_2$ gas 44 is also referred to herein as a test gas 44. FIG. 9B shows the calculated band structure of the lithium niobate surface 40 exposed to $CO_2$ gas 44 of FIG. 9A in accordance with the present application. FIG. 9C shows the calculated density of states of the lithium niobate surface 40 exposed to $CO_2$ gas 44 of FIG. 9A in accordance with the present application. The band gap of the lithium niobate surface 40 exposed to $CO_2$ gas 44 is 0.018 eV, which is lower than the band gap 0.025 eV of LN in a vacuum as shown in FIG. 3B.

FIG. 10A is a model of a hydrogen niobate surface exposed to $CO_2$ gas in accordance with the present application. The modeled hydrogen niobate material represented generally at 33 has a surface 45 that is exposed to $CO_2$ gas represented generally at 48. Specifically, the hydrogen niobate exposed to $CO_2$ gas 48 is referred to herein as hydrogen niobate 33. The $CO_2$ gas 48 is also referred to herein as a test gas 48. FIG. 10B shows the calculated band structure of the hydrogen niobate surface 45 exposed to $CO_2$ gas of FIG. 10A. FIG. 10C shows the calculated density of states of the hydrogen niobate surface 45 exposed to $CO_2$ gas of FIG. 10A. The bulk hydrogen niobate that is exposed to $CO_2$ gas 48 is represented generally as hydrogen niobate 33. The band gap of the hydrogen niobate surface 45 exposed to $CO_2$ gas 48 is approximately 0.294 eV, which is about equal to the band gap of HN in a vacuum (e.g., 0.242 eV) as shown in FIG. 4B.

Figure 11:
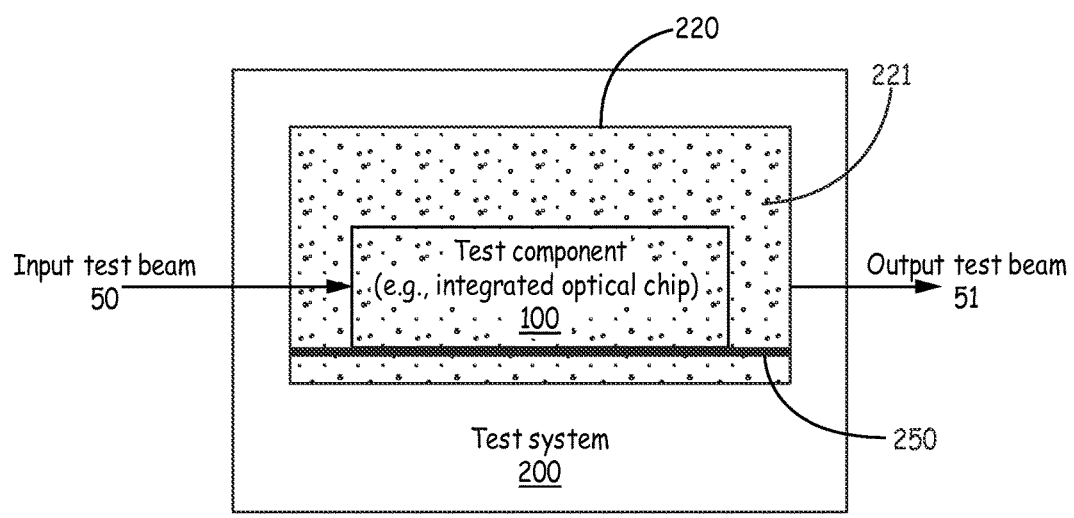
FIG. 11 shows a side view of an embodiment of a test component formed from an inorganic material positioned in a sealed enclosure filled with a selected gas while undergoing component performance testing in accordance with the present application.
Figure 12:
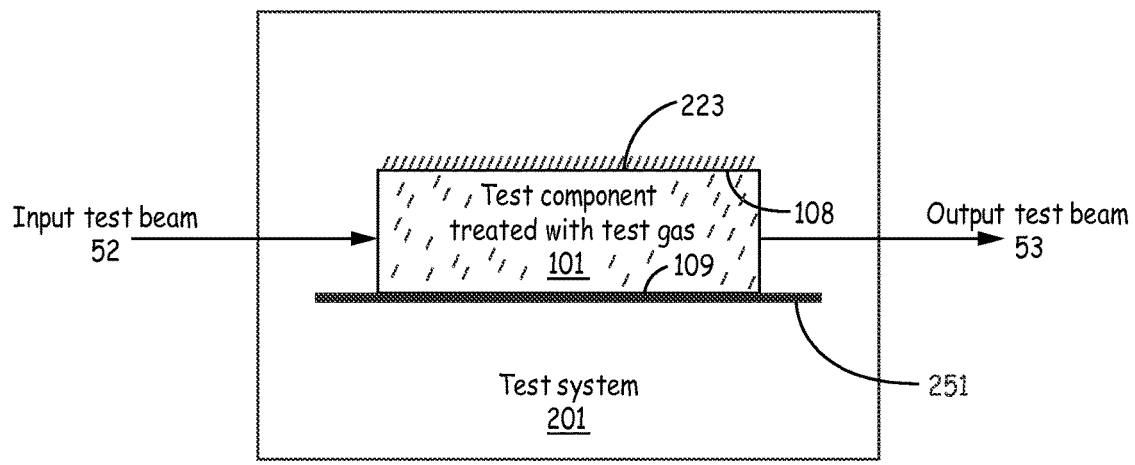
FIG. 12 shows a side view of an embodiment of a test component formed from an inorganic material that is treated with a selected gas prior to undergoing component performance testing in accordance with the present application.
Figure 13:
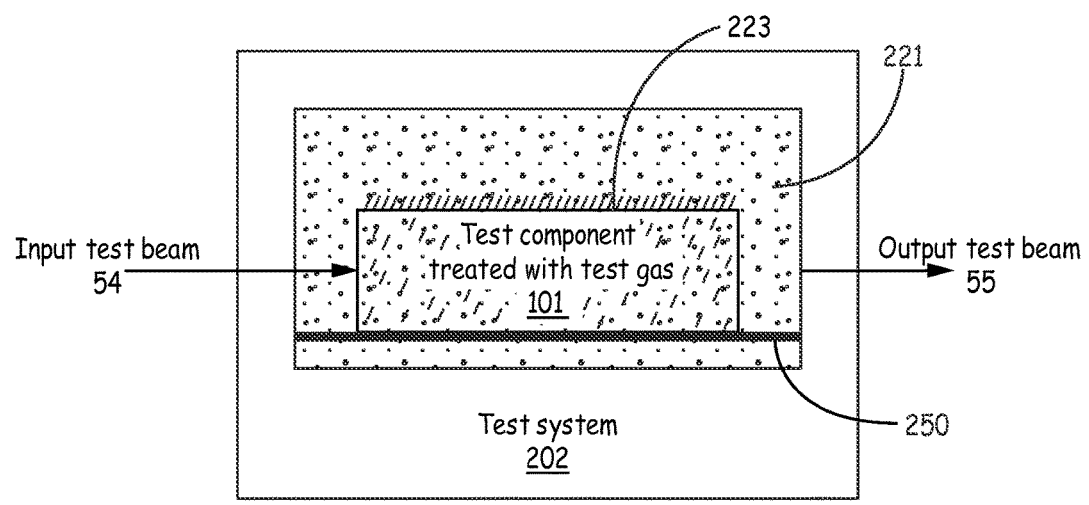
FIG. 13 shows a side view of an embodiment of a test component formed from an inorganic material that is treated with a first selected gas and positioned in a sealed enclosure filled with a second selected gas while undergoing component performance testing in accordance with the present application.

As shown in FIGS. 11-13, the gases are tested on test components that are exposed to one or more of the test gases, such as the gases in the listing of gases in Tables 1 and 2. The tests are done to confirm or verify the modeling described above. If the performance of the test device is improved as predicted by the software modeling, the test is positive.

FIG. 11 shows a side view of an embodiment of a test component 100 formed from an inorganic material positioned in a sealed enclosure 220 filled with a selected gas 221 while undergoing component performance testing in accordance with the present application. The "selected gas 211" is also referred to herein as a "selected-test gas 221" and a "fill gas". A sealed enclosure filled with the selected gas is also referred to herein as a "selected-gas-filled sealed enclosure". A test of the test component 100 is performed to determine if a performance of the test component 100 is improved by treatment with a selected-test gas 221. It is to be noted that the term "selected gas" is applicable to a gas selected for modeling, for treating a test component, or for treating an optical component in a system. The terms "optical component" and "integrated optical circuit" are used interchangeably herein. In general, as used herein the term "selected-test gas" is applicable to those gases used to treat (as defined above) a test component.

The test system 200 includes the test component 100 formed from a test material (e.g., LN or FIN) and a structure 250 to support the test component 100. As shown in FIG. 11 the structure 250 is a support structure attached to the sealed enclosure 220. Other types of support structures are possible. The test is an optical test that is done to determine if the performance of the test component 100 is improved by contact with the selected-test gas 221 in the sealed enclosure 220. An input test beam 50 is directed to the test component 100 and is optically coupled into the test component 100 to propagate through the test component 100 and to be output as one or more output test beam 51. In one implementation of this embodiment, an optical waveguide formed in the test component 100 is on or adjacent to a surface of the test component 100 that is exposed to the selected-test gas 221. In another implementation of this embodiment the test component 100 is an integrated optical chip 100. In this case, an optical waveguide is formed in the integrated optical chip 100 to support the optical modes of the optically coupled test beam 50 as it propagates through the integrated optical chip 100.

The selected-test gas 221 is selected by: numerically modeling at least one surface of the test material; simulating a plurality of exposures of the at least one surface of the modeled test material to a respective plurality of test gases (e.g., test gases 41, 46, 42, 47, 44, and 48 shown in respective FIGS. 5A, 6A, 7A, 8A, 9A, and 10A); simulating a plurality of interactions of the surface (e.g., surface 40 shown in FIGS. 5A, 7A, and 9A or surface 45 shown in FIGS. 6A, 8A, and 10A) of the material (e.g., material 21, 31, 22, 32, 23, and 33 shown in respective FIGS. 5A, 6A, 7A, 8A, 9A, and 10A) exposed to the respective plurality of test gases; and estimating a plurality of electronic band gaps of observed surface states for the respective plurality of test gases.

FIG. 12 shows a side view of an embodiment of a test component 101 (IOC 101) formed from an inorganic material that is treated with (e.g., exposed to) a selected gas 223 prior to undergoing component performance testing in accordance with the present application. As shown in FIG. 12, the test component 101 is positioned for testing in a test system 201. The test system 201 includes the test component 101 formed from an inorganic test material (e.g., LN or FIN) and a structure 251 to support the test component 101. As shown in FIG. 12 the structure 251 is a support structure on which the test component 101 is placed in order to couple an input test beam 52 into the test component 101. As shown in FIG. 12, the surface 109 of the test component 101 is placed on the structure 251. Other types of support structures are possible. The test is an optical test that is done to determine if the performance of the test component 101 is improved by contact with a selected-test gas 223 that has been used to treat at least a portion of the test component 101. An optical input test beam 52 is coupled to the optical component 101 and the one or more optical output test beam 53 is measured.

As shown in FIG. 12, a surface 108 of the test component 101 that opposes the surface 109 has been stabilized by an exposure to the selected-test gas 223. The surface of the test component 101 that is perpendicular to the surface 108 is also shown to be exposed to the selected-test gas 223 as indicated by the hash marks. In one implementation of this embodiment, an optical waveguide is formed in or adjacent to the surface 108. The optical waveguide is designed to support propagation of the optically coupled input test beam 52.

The selected-test gas 223 is selected in the same manner that selected-test gas 221 was selected as described above with reference to FIG. 11.

FIG. 13 shows a side view of an embodiment of a test component 101 formed from an inorganic material that is treated with a first selected gas 223 and positioned in a sealed enclosure 220 filled with a second selected gas 221 while undergoing component performance testing in accordance with the present application. A test of the test component 101 is performed to determine if a performance of the test component 101 is improved by treatment with a first selected gas 223 and a second selected-test gas 221. The selection of the first selected gas 223 and the second selected-test gas 221 are as described above with reference to FIG. 11. The optical testing of the test component 101 is as described above with reference to FIG. 11. In one implementation of this embodiment, the first selected gas 223 and the second selected-test gas 221 are the same gas.

Table 3 shows a listing of the preferred gas combinations and conditions. Column 1 of Table 3 lists the preferred gases and the column 2 of Table 3 shows the lowest bandgap for the associated gas in column 1.

TABLE 3

| Gas/condition | Gap eV |
|---|---|
| no gas | 0.242 |
| $4O_2$ | 0.349 |
| $2N_2O$ | 0.321 |
| $4N_2O$ | 0.607 |
| $6N_2O$ | 0.724 |
| $2N_2O$ optimized, then $4N_2$ added | 1.780 |
| $4N_2O$ optimized, then $4N_2$ added | 0.334 |
| $2N_2O + 4N_2$ optimized at same time | 0.094 |
| $4N_2O + 4N_2$ optimized at same time | 0.296 |
| $4N_2O + 4Xe$ optimized at same time | 0.313 |
| $4N_2O + 4CO_2$ optimized at same time | 0.435 |
| $4N_2O + 4O_2$ optimized at same time | 0.314 |
| $4N_2O$ optimized, then $4O_2$ added | 0.327 |
| $2N_2O$ optimized then 4Xe | 0.833 |
| $2N_2O$ optimized then 4Ne | 1.576 |

Other gases have a relatively high bandgap, with reference to the bandgap in a vacuum. Table 4 shows a listing of the beneficial gas combinations. Column 1 of Table 4 lists the preferred gases and the column 2 of Table 4 shows the lowest bandgap for the associated gas in column 1.

TABLE 4

| Gases/Gas Mixtures | Lowest bandgap (eV) |
|---|---|
| 4O | 2.802 |
| 2O | 2.066 |
| 4NO | 1.686 |
| $4NO_2$ | 1.662 |
| $4NO + 4CO_2$ | 1.232 |
| $4O_3$ | 1.080 |
| $4SO_2$ | 0.972 |
| $4O_3 + 4CO_2$ | 0.793 |
| $4NH_2CO2H$ | 0.692 |
| $4NH_3$ | 0.591 |
| $6NH_3$ | 0.552 |
| $4CO_2 + 4NH_3$ | 0.519 |
| 6CO | 0.495 |
| $4PMe_3$ | 0.494 |

TABLE 4-continued

| Gases/Gas Mixtures | Lowest bandgap (eV) |
|---|---|
| 4CO | 0.442 |
| $4O_2$ | 0.349 |

The modeling and testing described above indicates that a dilution gas can be combined with the preferred gases, which have a relatively high bandgap with reference to the bandgap in a vacuum, to enhance the stabilization of the inorganic material. Table 5 shows a listing of the beneficial gas combinations. Column 1 of Table 5 lists the preferred gases and the column 2 of Table 4 shows the lowest bandgap for the associated gas in column 1.

TABLE 5

| Dilution gases | Lowest bandgap eV |
|---|---|
| 4Rn | 0.284 |
| 4Xe | 0.320 |
| 4Kr | 0.288 |
| 4Ar | 0.293 |
| 4Ne | 0.292 |
| 4He | 0.290 |
| 4N2 | 0.293 |
| 6N2 | 0.299 |
| 4x butane | 0.336 |
| 4CO2 | 0.294 |

In one implementation of this embodiment, the gases are simultaneously introduced into an enclosure as a combined mixture. In another implementation of this embodiment, a first gas (for example, $N_2O$) is added first to the enclosure and then a second gas is added to the same enclosure. In yet another implementation of this embodiment, the first selected gas is $N_2O$ is added to the enclosure before the second selected gas, $N_2$. In yet another implementation of this embodiment, the first selected gas is $N_2O$ is added to the enclosure at the same time the second selected gas $CO_2$ is added. In this latter case, when $N_2O$ and $CO_2$ are added at the same time, the bandgap is high.

Non-reactive gases may be used as a second gas. Examples of nonreactive gases are $N_2$, $CO_2$, a noble gas, CO. Other non-reactive gases would include $NH_3$, $PH_3$, $PMe_3$, $O_2$, saturated hydrocarbons. The gases that are truly non-reactive gases are the noble gases and saturated hydrocarbons. The coordinating gases that coordinate on Nb but do not break bonds are $N_2$, $CO_2$, CO, $NH_3$, $PH_3$, $PMe_3$ and $O_2$. The gas $N_2O$ is either a reactive or a coordinating gas, depending upon the conditions.

In one implementation of this embodiment, first selected gas used to pretreat the lithium-niobate-based material is a reactive oxide such as $O_3$, O, NO, $NO_2$, $N_2O$, $SO_2$, SO and second selected gas, in which the lithium-niobate-based material is enclosed, is a nonreactive gas. For example, the first selected gas used to pretreat the lithium-niobate-based material can be selected from the following listing of reactive oxides: $O_3$, O, NO, $NO_2$, $N_2O$, $SO_2$, SO and second selected gas in which the lithium-niobate-based material is enclosed is a mixture of $N_2O$ and a noble gas.

In one implementation of this embodiment, a first selected gas used to pretreat the lithium-niobate-based material is a reactive oxide such as $O_3$, O, NO, $NO_2$, $N_2O$, $SO_2$, SO, and the second selected gas, in which the lithium-niobate-based material is enclosed, is a mixture of $N_2O$ and a non reactive gas.

The process of obtaining the highest coordination saturation may be achieved by alternate gases or treatments. For instance $N_2O$ may be used to either oxidize the surface or coordinate a neutral ($N_2O$) ligand to fulfill niobium coordination saturation.

$N_2O$ is known to form a reactive oxidant O species at elevated temperatures, so increasing the reactivity of $N_2O$ may be accomplished by various methods such as an increase in temperature. Temperatures in the 200-300° C. range may be needed without other activation methods. However other activation methods can be used to reduce the oxidation temperatures to as low as 100-200° C., by adding $O_2$ or air into the gas mixture and/or using an alkali activator impregnated at the surface which may be applied by a solution coat, dip or wash procedure of an alkali metal salt. Alkali activators also help to maintain reactivity of the surface toward $N_2O$ in the presence of water. In this context, an alternate processes use a combination of moisture-free IOC surface, and/or a pretreatment with an alkali metal salt, and the $N_2O$ used in an $O_2$ or an $O_2$ mixture (air, $N_2$ or $CO_2$ as examples of other gases in the mixture) at elevated temperatures at 100° C. or above.

As shown in FIGS. 14-17, at least one gas is used on modulator components used in a gyroscopic system. The at least one gas is selected to improve the performance of the modulator to provide a high performance gyroscopic system. These improved modulators overcome the problems of currently available optical modulator as described above. The at least one gas selected for use on the optical components in the gyroscopic system is selected based on the results of the tests on the test components shown in FIGS. 11-13. In one implementation of this embodiment, the high performance gyroscopic system is an interference fiber optic gyroscope (IFOG).

The selected treatment for the IOC to be used in the gyroscope should be made in consideration of the fabrication processes used to form the IOC, since any wet or dry etching processes potentially provide a pretreatment to the IOC.

In one implementation of the embodiments shown in FIGS. 14-17, the modulators are phase modulators. In another implementation of the embodiments shown in FIGS. 14-17, the modulators are frequency modulators. In yet another implementation of this embodiment, the modulators in the gyroscopic system of FIGS. 14-17 are formed from lithium niobate material. In yet another implementation of this embodiment, the modulators in the gyroscopic system of FIGS. 14-17 are formed from hydrogen niobate material (i.e., partially exchanged and annealed lithium niobate material). In yet another implementation of this embodiment, the optical components are in an optical system, other than a gyroscopic system, that includes at least one optical component formed from LN or FIN. In yet another implementation of this embodiment, the optical components are in a system that includes at least one optical component formed from an inorganic material other than LN or FIN.

Figure 14:
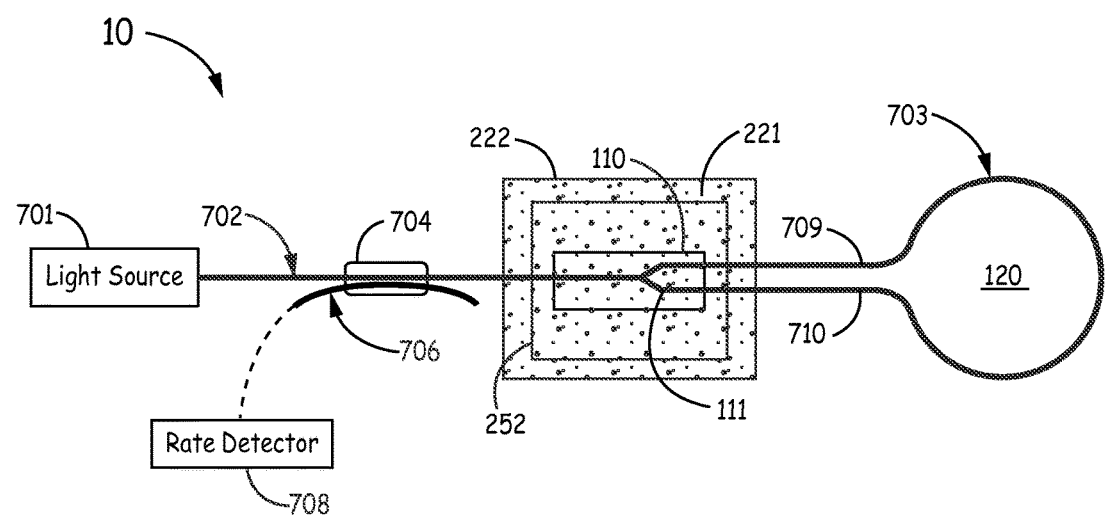
FIG. 14 shows an embodiment of a gyroscope system including optical components formed from inorganic material positioned in at least one sealed enclosure filled with a selected gas in accordance with the present application.

FIG. 14 shows an embodiment of an IFOG system 10 including IOC 110 formed from inorganic material positioned in at least one sealed enclosure 222 filled with a selected gas 221 in accordance with the present application. IFOG system 10 includes broadband light source 701. Broadband light source 701 generates a light signal that is comprised of many waves with different wavelengths and polarization states. Input fiber 702 couples broadband light source 701 to coupler 704 and the same fiber 702 couples light from coupler 704 to the waveguide of integrated optical circuit (IOC) 110 (also referred to herein as a phase modulator 110). Coupler 704 includes both input fiber 702 and output fiber 706. Output fiber 706 carries a returned signal from the IOC 110 to a rate detector 708 which reads the signal returning from the sensing fiber 703. IOC 110 includes a beam-splitting/combining element 111, a polarizing element, and two or more electrodes used for phase-modulation of the light beams passing through the IOC 110. In one embodiment, the beam-splitter is a y-branch beam-splitter 111, splitting the signal into two signals. In some embodiments, the polarizing element could be the wave-guide of the IOC 110 itself, while in other embodiments the polarizing element could be a separate element along the optical path. The signal from the broadband light source 701 is linearly polarized by passing through the IOC 110. Pigtail fibers 709 and 710 couple the IOC 110 to sensing coil 120. In one embodiment, the signal is depolarized with a depolarizer placed between the sensing coil 120 and the IOC 110. The depolarizer can be placed on either pigtail fiber 709 and/or 710. Sensing coil 120 comprises the sensing fiber 703 wound in a coil shape.

The IOC 110 is enclosed in a selected-gas-filled sealed enclosure 222. The selected-gas-filled sealed enclosure 222 is filled with the selected gas 221. The IOC 110 is supported on the structure 252 in the sealed enclosure 222. In one implementation of this embodiment, the sealed enclosure 222 supports the IOC 110. The structure 252 supports the IOC 110 to couple light between the laser 701 and the circulator 704. In another implementation of this embodiment, the structure 252 to support the test component 100 is at least a portion of the sealed enclosure 222. In yet another implementation of this embodiment, the structure 252 to support the test component 100 is positioned within the sealed enclosure 222.

As described above, the at least one selected gas 221 is selected based on: numerically modeling a surface of the material; simulating a plurality of exposures of the surface of the modeled material to a respective plurality of test gases; simulating a plurality of interactions of the surface of the material exposed to the respective plurality of test gases; and estimating a plurality of electronic band gaps of observed surface states for the respective plurality of test gases.

In one implementation of this embodiment, the IOC 110 the IFOG system 10 is undergoing gyro tests to determine if the performance of the IFOG system 10 is improved by the exposure of the IOC 110 to the selected gas. In another implementation of this embodiment, the IOC 110 is functional in IFOG system 10 which is operational to measure an orientation of a vehicle in which the IFOG system 10 is housed. In yet another implementation of this embodiment, the IOC 110 is in another type of gyroscope system. For example, if the optical system is a resonant fiber optic gyroscope, the IOC 110 can be replace with a CCW modulator and a CW modulator as is understandable to one skilled in the art.

Figure 15:
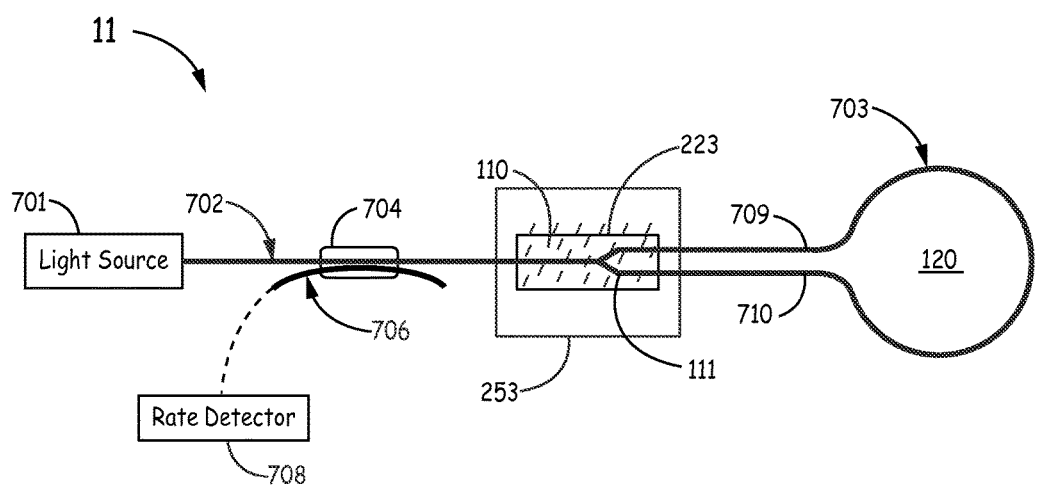
FIG. 15 shows an embodiment of a gyroscope system including optical components formed from inorganic material and treated with a selected gas in accordance with the present application.

FIG. 15 shows an embodiment of an IFOG system 11 including IOC 110 formed from inorganic material and treated with a selected gas 223 in accordance with the present application. The IOC 110 is a phase modulator that is supported on a support structure 253. The IFOG system 11 is similar in structure and function to the IFOG system 10 described above with reference to FIG. 14. The IOC 110 is supported on structure 253 and aligned to input the optical beam from the light source 701 via the optical fiber 702. The IOC 110 is treated with a selected gas 223. At least one surface (or portion) of each of the IOC 110 is exposed to the selected gas 223 prior to placing the IOC 110 on the support structure 253 in the IFOG system 11.

As described above, the at least one selected gas 223 is selected as described above with reference to FIG. 14. In one implementation of this embodiment, the IFOG system 11 is undergoing gyro system performance testing. In another implementation of this embodiment, the IFOG system 11 is operational in a moving vehicle.

Figure 16:
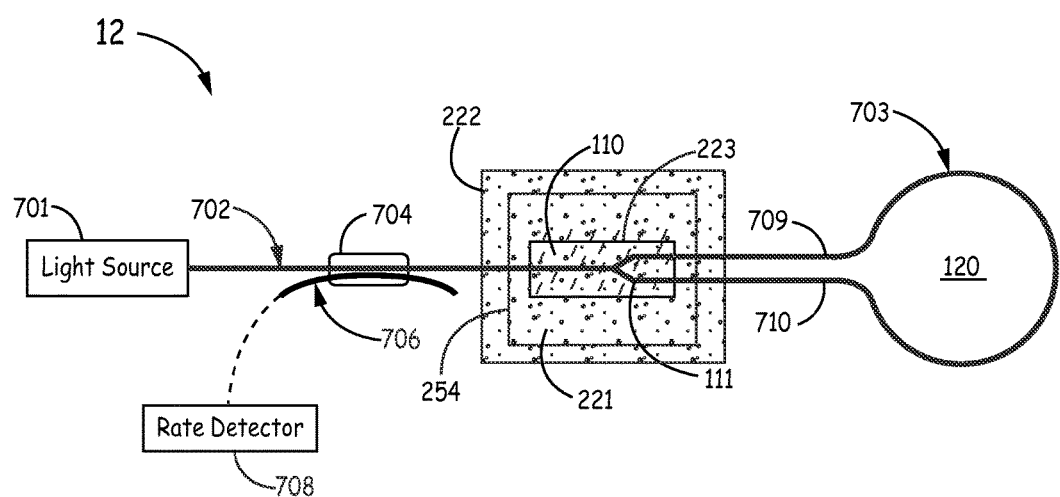
FIG. 16 shows a embodiment of a gyroscope system including optical components formed from an inorganic material that is treated with a first selected gas and positioned in a sealed enclosure filled with a second selected gas in accordance with the present application.

FIG. 16 shows an embodiment of an IFOG system 12 including IOC 110 formed from an inorganic material that is treated with a first selected gas 223 and positioned in a sealed enclosure 222 filled with a second selected gas 221 in accordance with the present invention. The IOC 110 is a phase modulator 110 supported on a support structure 254. The IFOG system 12 is similar in structure and function to the IFOG system 10 and 11 described above with reference to FIGS. 14 and 15.

In one implementation of this embodiment, the IFOG system 12 is undergoing gyro system performance testing. In another implementation of this embodiment, the IFOG system 12 is operational in a moving vehicle. In yet another implementation of this embodiment, the first selected gas 223 and the second selected gas 221 are the same gas.

Figure 17:
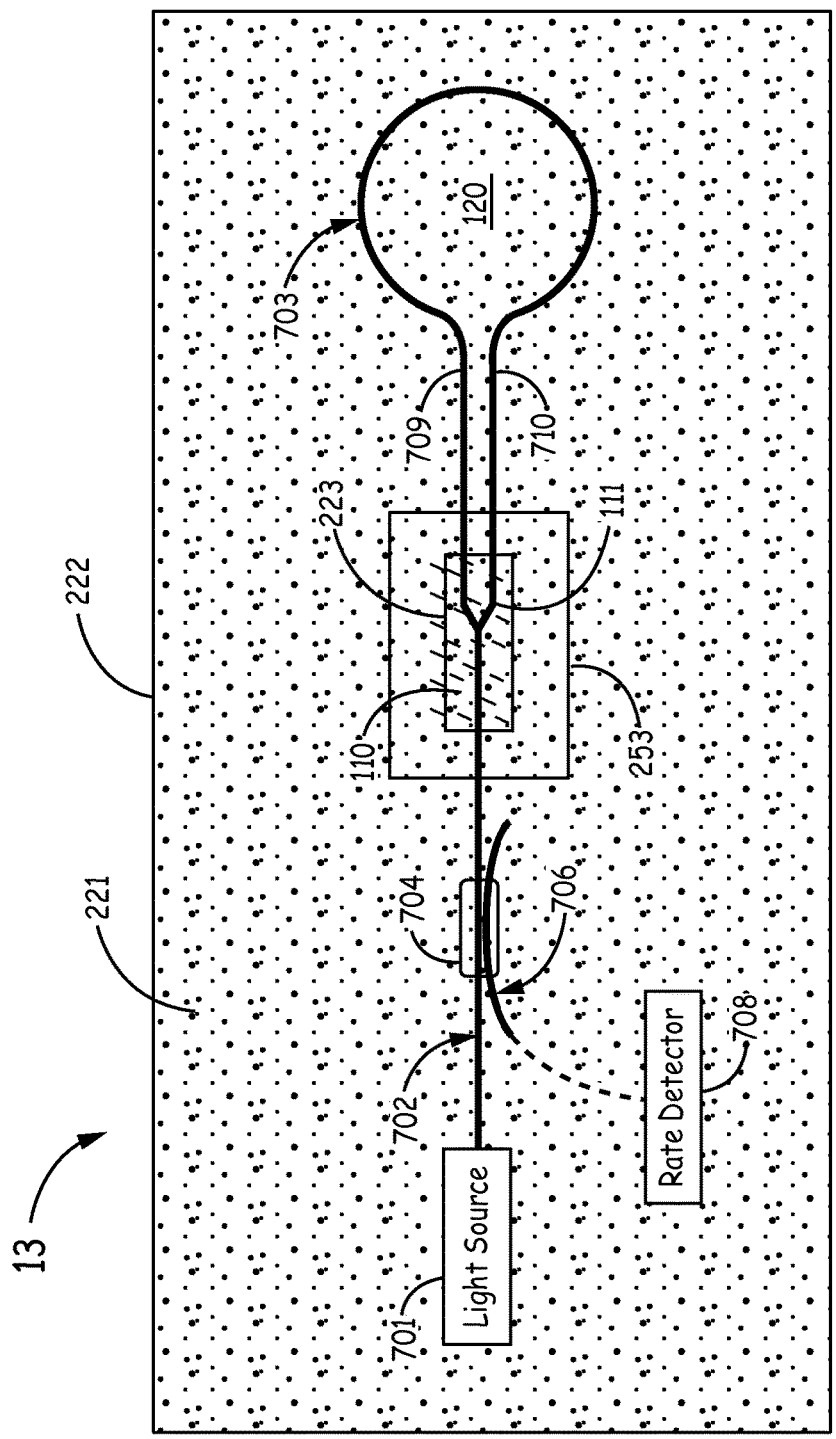
FIG. 17 shows a embodiment of a gyroscope system including optical components formed from an inorganic material that is treated with a first selected gas and positioned in a sealed enclosure filled with a second selected gas in accordance with the present application.

FIG. 17 shows an embodiment of an IFOG system 13 including IOC 110 formed from an inorganic material that is treated with a first selected gas 223 and positioned in a sealed enclosure 222 filled with a second selected gas 221 in accordance with the present invention. The IFOG system 13 is similar in structure and function to the IFOG systems 10-12 described above with reference to FIGS. 14-16. The IFOG system 13 of FIG. 17 differs from system 10 of FIG. 14, in that the enclosure 222 shown in FIG. 17 encases the stabilizing fill gas 221 in contact with the light source 701, the input fiber 702, the output fiber 706, the coupler 704, and the rate detector 708 in the IFOG system 13.

The IFOG system 13 is designed with appropriate stabilizing fill gases (e.g., 221) and/or treatment gases (e.g., 223) to stabilize the performance of the lithium niobate and to minimize reaction with the other components/materials in the IFOG system 13 (e.g., the light source 701, the input fiber 702, the output fiber 706, the coupler 704, and the rate detector 708) that are encased in the enclosure 222 with the stabilizing fill gases (e.g., 221). The fill-gases are chosen as an alternative to molecular-oxygen-($O_2$)-containing fill gases. Based on the modeling described herein, the selected fill-gases, which were modeled and then tested in a test system, have a better ability than $O_2$ to increase the band gap of the lithium niobate.

In one implementation of this embodiment, the IFOG system 13 is undergoing gyro system performance testing. In another implementation of this embodiment, the IFOG system 13 is operational in a moving vehicle. In yet another implementation of this embodiment, the first selected gas 223 and the second selected gas 221 are the same gas. In yet another implementation of this embodiment, the IOC 110 is not treated with a selected gas 223 but is positioned in the sealed enclosure 222 filled with a selected gas 221.

In one implementation of this embodiment, the LN material is pre-treated with (exposed to) $O_3$, $N_2O$, NO, $NO_2$ and $SO_2$ before assembly of the LN material phase modulator (or "LN phase modulator"). This can be done in place of a fill gas that encloses the LN or FIN phase modulator, to get around any negative effects of the fill gases themselves on the LN or HN phase modulator. The pre-treatment of the LN material for use in a phase modulator is considered within the assembly, if the gases are then flushed. Once the surface of the LN material is oxidized, the niobate should be more stable. At that point, the fill-gas is inert. A fully oxidized surface is less sensitive to $CO_2$ or products of organic decomposition.

In one implementation of this embodiment, LN material chips are designed to have a high band gap and are also designed with the complete system in mind so that the selected gases do not react to any outgassing by neighboring components. The system designer uses the modeling techniques described herein to balance the tradeoff between the reactive nature of a reactive species, which typically has a relatively high band gap, and the coordinating species, which typically has a slightly lower band gap, but both of which have higher band gaps than the untreated chip. A lone pair is an electron pair that will attach to an electron deficient center; lone pair is required with both reactive and coordinating species to satisfy the coordinate deficient state of niobium.

The gases described herein can be used as one of: 1) a coordinating gas (remediation gas) that includes a coordinating species; 2) a reactive gas that includes a reactive species; or 3) both a coordinating gas and a reactive gas. In one implementation of this embodiment, the same gas is used as both a coordinating gas and a reactive gas.

The gases disclosed herein are selected to bond to the uncoordinated sites on a surface of the lithium niobate (or hydrogen niobate) test component or the optical component in a system (e.g., a phase modulator) in order to provide relatively high band gaps. Analysis shows that LN (lithium niobate) has a much higher band gap recovery with $O_2$ than FIN (proton exchanged lithium niobate), suggesting that lithium, or possibly another cation, helps stabilize the larger band gap at the gas surface.

The gases are tested on test components and, when a suitable gas is selected, the selected gas is used on optical components (e.g., optical modulators) in a gyroscopic system in one of three ways described above with reference to FIGS. 14-17. In a first embodiment, the lithium niobate phase modulator is enclosed in the gas (FIG. 14). In a second embodiment, the lithium niobate is treated (exposed to) the selected gas prior to placing the lithium niobate phase modulator in the gyroscopic system (FIG. 15). In a third embodiment, the lithium niobate is treated (exposed to) the selected gas prior to enclosing the lithium niobate phase modulator in the selected gas. In this latter embodiment, a first selected gas is used to treat the surface of the lithium niobate and a second selected gas is encased with the lithium niobate phase modulator.

In one implementation of this embodiment, the phase modulators 110 in the IFOG systems 10, 12, and 13 described with reference to FIGS. 14, 16, and 17 are enclosed in a sealed enclosure with $N_2O$. In another implementation of this embodiment, the phase modulators 110 in the IFOG systems 10, 12, and 13 described with reference to FIGS. 14, 16, and 17 are enclosed in a sealed enclosure with $N_2O$ and at least one nonreactive gas. In yet another implementation of this embodiment, the phase modulators 110 in the IFOG systems 10, 12, and 13 described with reference to FIGS. 14, 16, and 17 are enclosed in a sealed enclosure with $N_2O$ and $N_2$. In embodiments of this latter case, the $N_2O$ is added to the enclosure prior to adding the $N_2$. In yet another implementation of this embodiment, the phase modulators 110 in the IFOG systems 10, 12, and 13 described with reference to FIGS. 14, 16, and 17 are enclosed in a sealed enclosure with $N_2O$ and at least one coordinating gas.

In yet another implementation of this embodiment, the phase modulators 110 in the IFOG systems 10, 12, and 13 described with reference to FIGS. 14, 16, and 17 are pre-treated with a first selected gas prior to enclosing the phase modulator in the sealed enclosure with a second selected gas. In some embodiments of this latter case, the first selected gas includes a reactive oxide and the second selected gas includes $N_2O$. In other embodiments of this latter case, the first selected gas includes a reactive oxide and the second selected gas includes a nonreactive gas. In other embodiments of this latter case, the first selected gas includes a reactive oxide and the second selected gas is mixture of $N_2O$ and a noble gas. In yet another implementation of this embodiment, the IOC is treated with the at least one of the at least one selected gas prior to operation of the system.

In yet another implementation of this embodiment, at least one IOC is at least one of: treated by at least one of the at least one selected gas prior to an operation of the system; and enclosed in a sealed enclosure filled with at least one of the at least one selected gas during the operation of the system.

FIG. 18 plots measurements of a gyroscope angle error measured in arc-second unit of angle for various configurations of gases. The angle error mechanism plotted is indicative of the lithium niobate modulator performance. The data shown herein permits one skilled in the art to select a fill gas for an integrated optical chip to improve the function of the integrated optical chip. In one implementation of this embodiment, the integrated optical chip includes another crystalline material other than lithium niobate, in which case the modeling described herein is applied to the other type of crystalline material.

FIG. 19 is a flow diagram of an embodiment of a method 1900 to determine if a gas stabilizes the surface states of a material in accordance with the present application. When the band gap of the material increases above the band gap of the modulator in a vacuum and approaches the band gap of the bulk material in air, it is determined that the gas has stabilized the surface states of the material. The method 1900 is applicable to the modeling done in FIGS. 1A-10C.

At block 1902, a surface (e.g., surface 40 in FIGS. 1A, 3A, 5A, 7A, and 9A or surface 45 in FIGS. 2A, 4A, 6A, 8A, and 10A) of the material (e.g., material 20 in FIGS. 1A, 3A, 5A, 7A, and 9A or material 30 45 in FIGS. 2A, 4A, 6A, 8A, and 10A) is numerically modeled. The bulk material is modeled as a periodic unit cell containing an infinite layer of the material with vacuum space above and below the infinite layer.

At block 1904, a plurality of exposures of the surface of the modeled material to a respective plurality of test gases are simulated. The simulation is done for each of the test gases in a plurality of test gases. The test gases include at least two of the gases listed in Tables 1 and 2 above.

At block 1906, a plurality of interactions of the surface of the material exposed to the respective plurality of test gases are simulated.

Blocks 1908 to 1914 are used together to estimate the plurality of electronic band gaps of the observed surface states for a test gas in the plurality of test gases. At block 1908, the test gas is energy-optimized to one surface of the material. At block 1910, specific electronic bands for the test gas energy-optimized to the one surface of the material are calculated. At block 1912, the density of states for the test gas energy-optimized to the one surface of the material is calculated.

At block 1914, a band structure based on the calculated electronic bands and the density of states for the test gas energy-optimized to the one surface of the material is determined. The band energies above and below the minimum in the density of states nearest the Fermi level are used to estimate the electronic band gap for the test gas. In one implementation of this embodiment, method 1900 is performed by implementing quantum-mechanics software employing density functional theory.

As described above, the gases that are determined (by modeling) to increase the band gap are selected for testing on test components. FIG. 20 is a flow diagram of an embodiment of a method 2000 to test a test component exposed to a gas to stabilize surface states of a material forming the test component in accordance with the present application.

At block 2002, at least one of the test gases in the plurality of test gases is selected for testing on a test component formed from the material (e.g., LN or FIN). The selecting is based on the estimated respective plurality of electronic band gaps for the respective plurality of test gases on the material in accordance with method 1900. In one implementation of this embodiment, the selecting is also based on minimizing reaction of the at least one test gas in the plurality of test gases with at least one of: other components (e.g., the light source 710 and detector 708) in an IFOG system 13 as described above with reference to FIG. 17 in which the test component is to eventually be operational and other materials in the system in which the test component is to eventually be operational. In one implementation of this embodiment, the test system (e.g., test systems 200-202 described above with reference to FIGS. 11-13) includes the other materials and/or other components to evaluate the effect during the testing.

At block 2004, it is determined if the test component is to be treated (e.g., exposed to the selected test gas, other than a fill gas, prior to testing). When the test system, includes a test component that is treated with a test gas, the flow proceeds to from block 2004 to 2206. At block 2006, at least a portion of the test component is treated with the selected at least one test gas of the plurality of test gases. The "selected at least one test gas of the plurality of test gases" is also referred to herein as a "selected at least one of the plurality of test gases" and as a "selected test gas". In one implementation of block 2006, the "selected at least one of the plurality of test gases" is a "first-selected-test gas". At block 2008, it is determined in if the treated test component is to be enclosed in a sealed enclosure with a test gas. If it is determined at block 2008, that the treated test component is not to be enclosed in a sealed enclosure with a test gas, the flow of method 2000 proceeds to block 2010. At block 2010, the test component is tested. In one implementation of this embodiment of block 2010 of method 2000, the test component 101 is tested in the test system 201 of FIG. 12.

If it is determined at block 2008, that the treated test component is to be enclosed in a sealed enclosure with a test gas, the flow of method 2000 proceeds to block 2012. At block 2012, the treated test component is enclosed in a sealed enclosure filled with the selected at least one test gas of the plurality of test gases. In one implementation of block 2012, the "selected at least one of the plurality of test gases" is a "second selected one of the at least one of the plurality of test gases", which is also referred to herein as "a second-selected-test gas". In this case, the test component is treated with a first-selected-test gas and enclosed in a second-selected-test gas.

At block 2014, the test component is tested. In one implementation of this embodiment of block 2014 of method 2000, the test component 101 is enclosed in sealed enclosure 221 and is tested in the test system 202 of FIG. 13.

When the test system, does not include a test component that is treated with a test gas (other than a fill gas) prior to testing, the flow proceeds to from block 2004 to 2216. At block 2016, the test component is enclosed in a sealed enclosure filled with the selected at least one of the plurality of test gases. At block 2018, the test component is tested in the fill gas. In one implementation of this embodiment of block 2018 of method 2000, the test component 100 is enclosed in sealed enclosure 221 and is tested in the test system 200 of FIG. 11.

In one implementation of this embodiment, a complete testing is done for a plurality of test gases and a matrix of first and second test gases for a plurality of test component formed from a plurality of inorganic materials. In this complete testing every type of test component is tested in each of the methods of blocks 2010, 2014 and 2018 in order to determine which test gas or combination of test gases in which type of testing system (e.g., test system 200, 201, or 202) provides the best performance. In one implementation of this embodiment, a system (e.g., a gyroscopic system 10, 11, or 12) uses an optical component that is formed and prepared in the manner of the test component and test system that provide the best performance.

It will be understood that various modifications to the described embodiments may be made without departing from the spirit and scope of the invention. In the following pages the chemical notations are not in subscript form but are in a form which is understandable to one skilled in the art.

Example Embodiments

Example 1 includes a system comprising: at least one integrated optical circuit (IOC) formed from at least one material, wherein a performance of the at least one IOC is improved by exposure to at least one selected gas; and a support-structure configured to support the at least one IOC to couple light between other components.

Example 2 includes the system of Example 1, wherein the at least one selected gas includes a reactive gas.

Example 3 includes the system of any of Examples 1-2, wherein the at least one selected gas includes at least one reactive gas and at least one nonreactive gas.

Example 4 includes the system of any of Examples 1-3, wherein the system is a gyroscope system, wherein the at least one IOC formed from at least one material is a phase modulator formed from a lithium-niobate-based material.

Example 5 includes the system of Example 4, further comprising: an enclosure, wherein the support structure is one of: at least a portion of the enclosure in which the phase modulator is enclosed; or positioned within the enclosure in which the phase modulator is enclosed, and wherein at least one of the at least one selected gas is enclosed in the enclosure with the phase modulator.

Example 6 includes the system of Example 5, wherein the at least one selected gas includes at least a first selected gas and a second selected gas.

Example 7 includes the system of Example 6, wherein the first selected gas is added to the enclosure prior to adding the second selected gas to the enclosure.

Example 8 includes the system of any of Examples 6-7, wherein the lithium-niobate-based material is pre-treated with the first selected gas prior to enclosing the phase modulator in the enclosure with the second selected gas.

Example 9 includes the system of Example 8, wherein the at least one selected gas includes at least a first selected gas and a second selected gas, wherein the first selected gas includes a reactive oxidizing gas and the second selected gas includes N2O.

Example 10 includes the system of any of Examples 4-9, wherein the at least one selected gas includes at least a first selected gas and a second selected gas, and wherein the first selected gas is N2O and the second selected gas is N2.

Example 11 includes the system of any of Examples 4-10, wherein the at least one selected gas includes at least a first selected gas and a second selected gas wherein the first selected gas includes a reactive oxidizing gas and the second selected gas includes a nonreactive gas.

Example 12 includes the system of any of Examples 4-11, wherein the at least one selected gas includes at least a first selected gas and a second selected gas, and wherein the IOC is treated with the at least one of the selected gases prior to operation of the IOC.

Example 13 includes the system of any of Examples 1-12, wherein the at least one selected gas includes at least one first selected gas and at least one second selected gas, and wherein the at least one IOC is: treated by the at least one first selected gas prior to an operation of the system; and enclosed in a sealed enclosure filled with the at least one second selected gas during the operation of the IOC.

Example 14 includes the system of any of Examples 1-13, wherein the at least one selected gas includes at least a first selected gas and a second selected gas, and wherein the first selected gas includes a reactive oxidizing gas and the second selected gas is mixture of N2O and a non reactive gas.

Example 15 includes a gyroscope system comprising: at least one phase modulator formed from a lithium-niobate-based material, wherein a performance of the at least one phase modulator is improved by exposure to at least one selected gas; and a sealed enclosure in which the at least one phase modulator is enclosed, wherein at least one of the at least one selected gas is enclosed in the enclosure with the at least one phase modulator.

Example 16 includes the gyroscope system of Example 15, wherein the at least one of the at least one selected gas includes N2O.

Example 17 includes the gyroscope system of any of Examples 15-16, wherein the at least one selected gas includes at least a first selected gas and a second selected gas, wherein the first selected gas includes a reactive oxidizing gas and the second selected gas includes N2O.

Example 18 includes the gyroscope system of any of Examples 15-17, wherein the at least one selected gas includes at least a first selected gas and a second selected gas, wherein the lithium-niobate-based material is pre-treated with at least the first selected gas, by one of: exposing the lithium-niobate-based material to the first selected gas prior to enclosing the phase modulator in the sealed enclosure with the second selected gas; and exposing the lithium-niobate-based material to the first selected gas after enclosing the phase modulator in the enclosure in order to equilibrate the lithium-niobate-based material to the first selected gas prior to adding the second selected gas to the enclosure.

Example 19 includes the gyroscope system of Example 18, wherein the first selected gas used to pretreat the lithium-niobate-based material is a reactive oxiding gas and wherein the second selected gas is N2O.

Example 20 includes a method to determine a gas to stabilize surface states of a material, the method comprising: numerically modeling a surface of the material; simulating a plurality of exposures of the surface of the modeled material to a respective plurality of test gases; simulating a plurality of interactions of the surface of the material exposed to the respective plurality of test gases; and estimating a plurality of electronic band gaps of observed surface states for the respective plurality of test gases, wherein numerically modeling the surface of the material comprises: modeling the surface of the material by forming a periodic unit cell of the material including an infinite layer of the material with a vacuum above and below the infinite layer, and wherein estimating the plurality of electronic band gaps of the observed surface states, comprises, for a test gas in the plurality of test gases: energy-optimizing the test gas to one surface of the material; calculating specific electronic bands for the test gas energy-optimized to the one surface of the material; calculating density of states for the test gas energy-optimized to the one surface of the material; and determining a band structure based on the calculated electronic bands and the density of states for the test gas energy-optimized to the one surface of the material, wherein band energies above and below the minimum in the density of states nearest the Fermi level are used to estimate electronic band gap for the test gas.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A system comprising:
   at least one integrated optical circuit (IOC) formed from a lithium-niobate-based material, wherein a bandgap of the at least one IOC is increased by exposure to at least one selected fill gas as compared to an IOC operated in a vacuum; and
   a support-structure configured to support the at least one IOC to couple light between other components; and
   a sealed enclosure enclosing the at least one IOC and the at least one selected fill gas;
   wherein the at least one selected fill gas includes one of:
      nitrogen oxide (NO);
      nitrogen dioxide ($NO_2$);
      sulfur dioxide ($SO_2$);
      nitrous oxide ($N_2O$);
      ammonia ($NH_3$); or
      trimethylphosphine ($PMe_3$).

2. The system of claim 1, wherein the at least one selected fill gas further includes at least one dilution gas.

3. The system of claim 2, wherein the at least one selected fill gas includes $N_2O$.

4. The system of claim 2, wherein the at least one dilution gas includes at least one of: $N_2$, a noble gas, $CO_2$, or a saturated hydrocarbon.

5. The system of claim 1, wherein the system is a gyroscope system, wherein the at least one IOC formed from the lithium-niobate-based material is a phase modulator.

6. The system of claim 5, wherein the support structure is one of: at least a portion of the enclosure in which the phase modulator is enclosed; or positioned within the enclosure in which the phase modulator is enclosed, and wherein at least one of the at least one selected fill gas is enclosed in the enclosure with the phase modulator.

7. The system of claim 6, wherein the at least one selected fill gas includes at least a first selected fill gas and a second selected fill gas.

8. The system of claim 7, wherein the first selected fill gas is added to the enclosure prior to adding the second selected fill gas to the enclosure.

9. The system of claim 7, wherein the first selected fill gas is $N_2O$ and the second selected fill gas is $N_2$.

10. The system of claim 5, wherein the lithium-niobate-based material is pre-treated with a gas prior to enclosing the phase modulator in the enclosure with the at least one selected fill gas.

11. The system of claim 5, wherein the gyroscope system further comprises:
    a light source;
    a coupler;
    an input fiber coupled to the light source, the coupler, and the phase modulator;
    an output fiber coupled to the coupler;
    a sensing coil coupled to the phase modulator; and
    a rate detector coupled to the output fiber.

12. The system of claim 11, wherein the at least one selected fill gas includes $N_2O$.

13. The system of claim 1, wherein the at least one selected fill gas includes $N_2O$.

14. A gyroscope system comprising:
    at least one phase modulator formed from a lithium-niobate-based material, wherein a bandgap of the at least one phase modulator is increased by exposure to at least one selected gas as compared to a phase modulator operated in a vacuum; and
    a sealed enclosure in which the at least one phase modulator is enclosed, wherein at least one of the at least one selected gas is enclosed in the enclosure with the at least one phase modulator, wherein the at least one selected gas enclosed in the enclosure with the at least one phase modulator includes one of:
       nitrogen oxide (NO);
       nitrogen dioxide ($NO_2$);
       sulfur dioxide ($SO_2$);
       nitrous oxide ($N_2O$);
       ammonia ($NH_3$); or
       trimethylphosphine ($PMe_3$).

15. The gyroscope system of claim 14, wherein the at least one selected gas includes $N_2O$.

16. The gyroscope system of claim 14, wherein the at least one selected gas includes at least a first selected gas and a second selected gas, wherein the lithium-niobate-based material is pre-treated with at least the first selected gas, by one of:
    exposing the lithium-niobate-based material to the first selected gas prior to enclosing the phase modulator in the sealed enclosure with the second selected gas; and
    exposing the lithium-niobate-based material to the first selected gas after enclosing the phase modulator in the enclosure in order to equilibrate the lithium-niobate-based material to the first selected gas prior to adding the second selected gas to the enclosure.

17. The system of claim 14, wherein the at least one selected gas includes at least a first selected gas and a second selected gas.

18. The system of claim 14, wherein the gyroscope system further comprises:
    a light source;
    a coupler;
    an input fiber coupled to the light source, the coupler, and the phase modulator;
    an output fiber coupled to the coupler;
    a sensing coil coupled to the phase modulator; and
    a rate detector coupled to the output fiber.

19. The system of claim 18, wherein the at least one selected gas includes $N_2O$.

20. The system of claim 14, wherein the at least one selected gas further includes a dilution gas.

* * * * *